(12) United States Patent
Maeda et al.

(10) Patent No.: US 12,451,389 B2
(45) Date of Patent: Oct. 21, 2025

(54) CONVEYING APPARATUS AND CONVEYING METHOD OF SUBSTRATE

(71) Applicant: DISCO CORPORATION, Tokyo (JP)

(72) Inventors: Yuto Maeda, Tokyo (JP); Naoaki Tadami, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 888 days.

(21) Appl. No.: 17/651,472

(22) Filed: Feb. 17, 2022

(65) Prior Publication Data

US 2022/0281121 A1      Sep. 8, 2022

(30) Foreign Application Priority Data

Mar. 5, 2021   (JP) .................................. 2021-035760
Oct. 25, 2021  (JP) .................................. 2021-174070

(51) Int. Cl.
    *H01L 21/687*     (2006.01)
    *B25J 9/04*         (2006.01)
    (Continued)

(52) U.S. Cl.
    CPC ........ *H01L 21/68707* (2013.01); *B25J 9/042* (2013.01); *B25J 11/0095* (2013.01); *B25J 15/0691* (2013.01); *H01L 21/6838* (2013.01)

(58) Field of Classification Search
    CPC ............ H01L 21/68707; H01L 21/6838; B25J 11/0095
See application file for complete search history.

(56) References Cited

U.S. PATENT DOCUMENTS 4,904,012 A * 2/1990 Nishiguchi ......... H01L 21/6838
                                           29/743
5,277,539 A * 1/1994 Matsui ............. H01L 21/67778
                                         414/730
(Continued)

FOREIGN PATENT DOCUMENTS

JP           3082603 B2 * 8/2000
JP        2004040011 A * 2/2004
(Continued)

OTHER PUBLICATIONS

Search report issued in counterpart Singapore patent application No. 10202201839P, dated Jul. 11, 2023.

(Continued)

*Primary Examiner* — Thomas E Lazo
(74) *Attorney, Agent, or Firm* — Greer Burns & Crain Ltd.

(57) ABSTRACT

There is provided a conveying apparatus having a holding surface that holds a held surface of a substrate to convey the substrate. The conveying apparatus includes a holding pad that gets contact with an outer circumferential part of the held surface of the substrate or a side surface of the substrate and forms a space to be filled with water between the held surface of the substrate and the holding surface, a movement unit that causes the holding pad to move in such a direction as to get closer to or further away from the held surface, a water supply unit that supplies the water to the space, and a suction unit that sucks the water with which the space is filled and improves a force of holding the substrate. The conveying apparatus holds the substrate by the holding pad and conveys the substrate with the interposition of the water.

12 Claims, 19 Drawing Sheets

(51) Int. Cl.
*B25J 11/00* (2006.01)
*B25J 15/06* (2006.01)
*H01L 21/683* (2006.01)

(56) References Cited

U.S. PATENT DOCUMENTS

| | | | |
|---|---|---|---|
| 10,522,373 B2 * | 12/2019 | Kuwana | B24B 47/10 |
| 2015/0235888 A1 * | 8/2015 | Iida | G05B 19/4189 |
| | | | 414/816 |
| 2015/0246447 A1 * | 9/2015 | Furuichi | B25J 15/0616 |
| | | | 294/188 |
| 2016/0049326 A1 * | 2/2016 | Onishi | B25J 11/0095 |
| | | | 294/188 |
| 2018/0093361 A1 * | 4/2018 | Yamanaka | B24B 37/34 |
| 2018/0204746 A1 * | 7/2018 | Kuwana | H01L 21/67219 |
| 2018/0358250 A1 * | 12/2018 | Sekiya | H01L 21/67769 |

FOREIGN PATENT DOCUMENTS

| | | | |
|---|---|---|---|
| JP | 2008074565 A | | 4/2008 |
| JP | 2009252877 A | * | 10/2009 |
| JP | 2009253244 A | | 10/2009 |
| JP | 2020161636 A | * | 10/2020 |

OTHER PUBLICATIONS

Office Action issued in counterpart German patent application No. 10 2022 201 977.6, dated Aug. 30, 2025.

* cited by examiner

CONVEYING APPARATUS AND CONVEYING METHOD OF SUBSTRATE

BACKGROUND OF THE INVENTION

Field of the Invention

The present invention relates to a conveying apparatus that conveys a substrate and a conveying method of a substrate.

Description of the Related Art

In a substrate treatment unit, when a substrate is conveyed, it is required to convey the substrate without contact with a surface for which treatment has been executed and a region in which devices are formed, in order to prevent a foreign matter from adhering to the substrate and prevent the substrate from being scratched.

For this purpose, a system in which a substrate is conveyed in a contactless manner by using the Bernoulli effect, an edge clamp system in which a substrate is conveyed with only an outer circumferential part of the substrate clamped, and so forth have been developed. However, there are problems that the holding force is weak in the contactless conveyance by the Bernoulli effect and that the substrate bends when the size of the substrate is large in the edge clamp system.

Further, the following conveying apparatus has also been developed. In order to convey a substrate without contact with a surface for which treatment has been executed and a region in which devices are formed, the conveying apparatus makes a gap between the substrate and a holding pad, causes a layer of water to intervene in this gap, and holds the substrate by the holding pad with use of the surface tension of the water and conveys the substrate (for example, refer to Japanese Patent Laid-open No. 2009-252877).

SUMMARY OF THE INVENTION

Further, in an apparatus having a mechanism that cleans a substrate through pressing a sponge against a surface on the side opposite to a held surface in the substrate and rotating the sponge in the state in which the substrate is held by a conveying unit, the holding force needs to be set strong. However, in the conveying pad that uses the Bernoulli effect, the edge clamp system, or the conveying apparatus that holds a substrate on the holding pad by the surface tension of water and conveys the substrate, there is a problem that the held substrate also rotates in such a manner as to be dragged by the rotation of the sponge for cleaning and it is impossible to normally clean the substrate.

Moreover, in the edge clamp system, there is also a problem that a clamp member that clamps a substrate becomes an obstacle and it is impossible to clean the whole of the outer circumferential part of the substrate.

Thus, an object of the present invention is to provide a conveying apparatus and a conveying method of a substrate that can convey a substrate without direct contact with a region for which treatment has been executed while improving the holding force.

In accordance with an aspect of the present invention, there is provided a conveying apparatus having a holding surface that holds a held surface of a substrate to convey the substrate. The conveying apparatus includes a holding pad that gets contact with an outer circumferential part of the held surface of the substrate or a side surface of the substrate and forms a space to be filled with water between the held surface of the substrate and the holding surface, a movement unit that causes the holding pad to move in such a direction as to get closer to or further away from the held surface, a water supply unit that supplies the water to the space, and a suction unit that sucks the water with which the space is filled and improves a force of holding the substrate. The conveying apparatus holds the substrate by the holding pad and conveys the substrate with the interposition of the water.

The suction unit may have a suction pump that is connected to a suction source and the space and includes an opening-closing valve controlled to suck a certain amount of water with which the space is filled.

In the conveying apparatus, the movement unit may have an arm connected to the holding pad through a suction pump and a raising-lowering unit that raises and lowers the arm, and the suction unit may drive the suction pump in association with rising and lowering of the arm and suck the water with which the space is filled.

In the conveying apparatus, the held surface held by the holding pad in the substrate may have a recess part formed at the center and a protrusion part that surrounds the recess part, and the holding pad may get contact with the protrusion part.

In the conveying apparatus, the holding pad may have the holding surface opposed to the held surface, the holding surface may have a recess part formed at the center and a protrusion part that surrounds the recess part, and the protrusion part may get contact with the outer circumferential part of the held surface of the substrate or the side surface of the substrate and form the space to be supplied with the water between the holding surface and the substrate.

The conveying apparatus may further include an ultrasonic vibrator that gives vibrations to the water.

The conveying apparatus may have one or a plurality of suction holes that communicate with a suction source and hold under suction the outer circumferential part of the held surface in an outer circumferential part of the holding pad.

In accordance with another aspect of the present invention, there is provided a conveying method of a substrate in which a held surface of the substrate is held by a holding surface of a holding pad and the substrate is conveyed. The conveying method includes a water supply step of supplying water to the held surface of the substrate, a holding pad contact step of bringing an outer circumferential part of the held surface of the substrate or a side surface of the substrate into contact with the holding surface and forming a space to be filled with the water, and a suction step of sucking the water with which the space is filled and improving a force of holding the substrate.

According to the aspect and the other aspect of the present invention, an effect that the substrate can be conveyed without direct contact with a region for which treatment has been executed while the holding force is improved is provided.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Embodiments of the present invention will be described below with reference to the accompanying drawings. The present invention is not limited by contents described in the following embodiments. Further, what can easily be envisaged by those skilled in the art and what are substantially the same are included in constituent elements described below. Moreover, configurations described below can be combined as appropriate. In addition, various kinds of omission, replacement, or change of a configuration can be carried out without departing from the gist of the present invention.

First Embodiment

Figure 1:
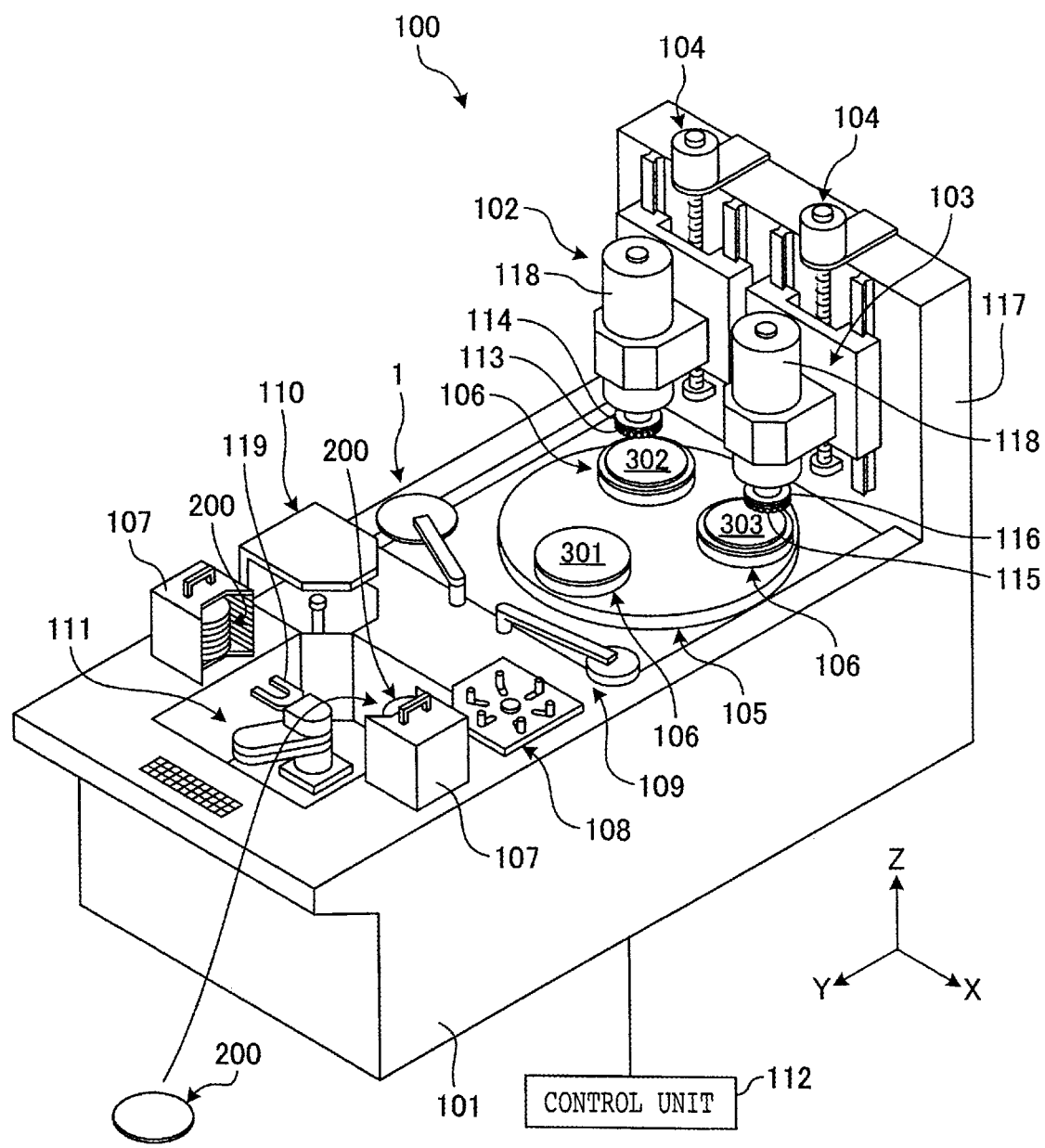
FIG. 1 is a perspective view illustrating a configuration example of a processing apparatus including a carrying-out unit that is a conveying apparatus according to a first embodiment.
Figure 2:
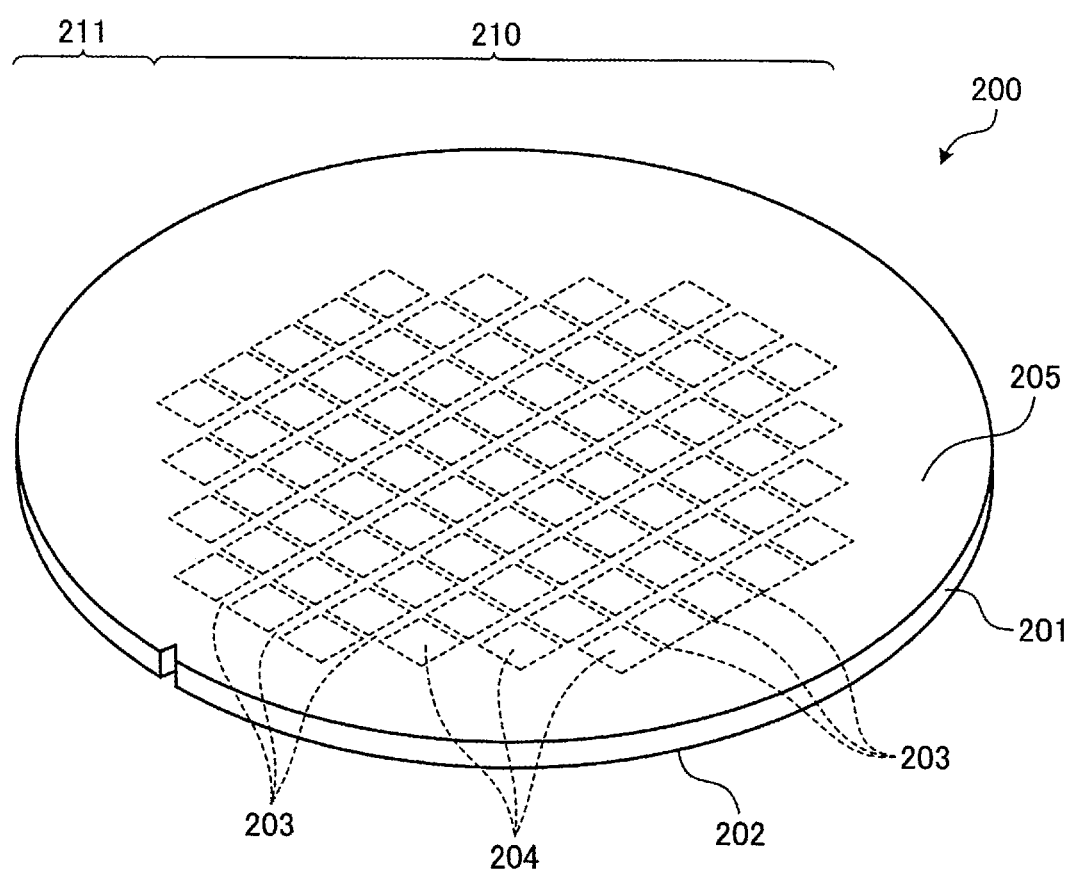
FIG. 2 is a perspective view illustrating a substrate of a processing target of the processing apparatus illustrated in FIG. 1.
Figure 3:
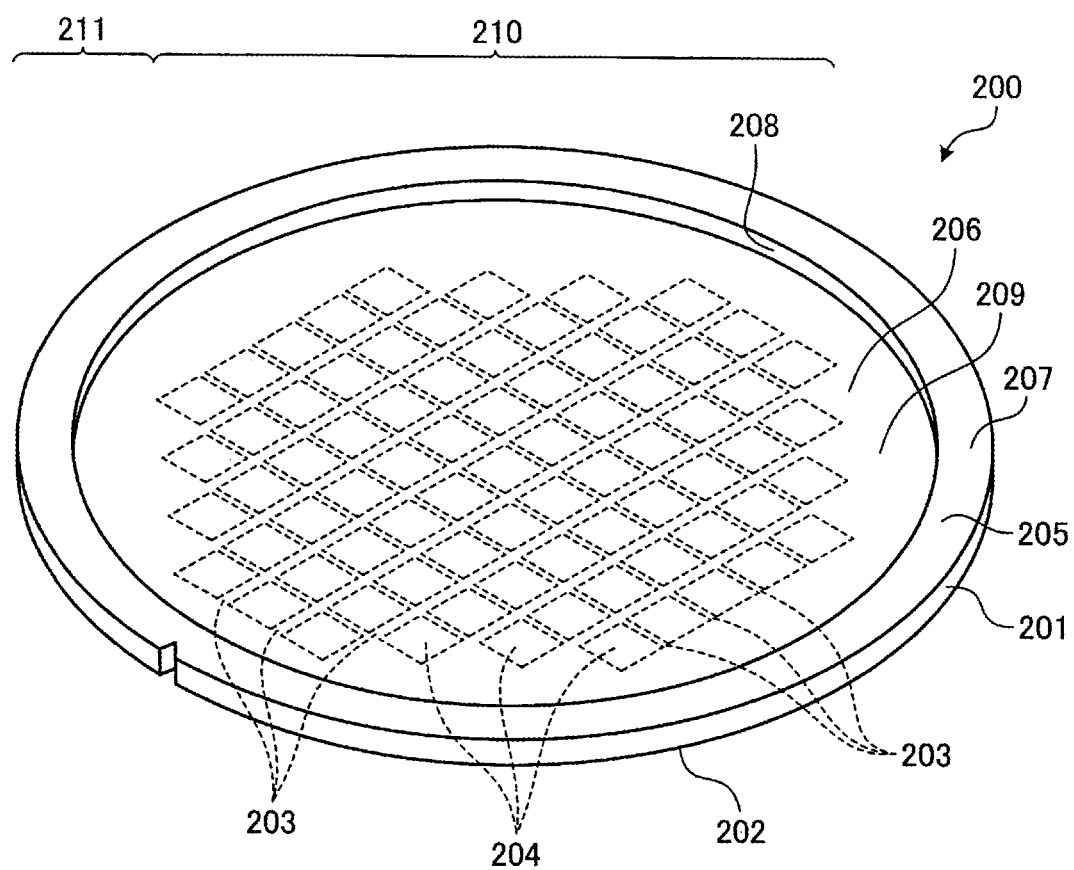
FIG. 3 is a perspective view illustrating the state after processing of the substrate illustrated in FIG. 2.
Figure 4:
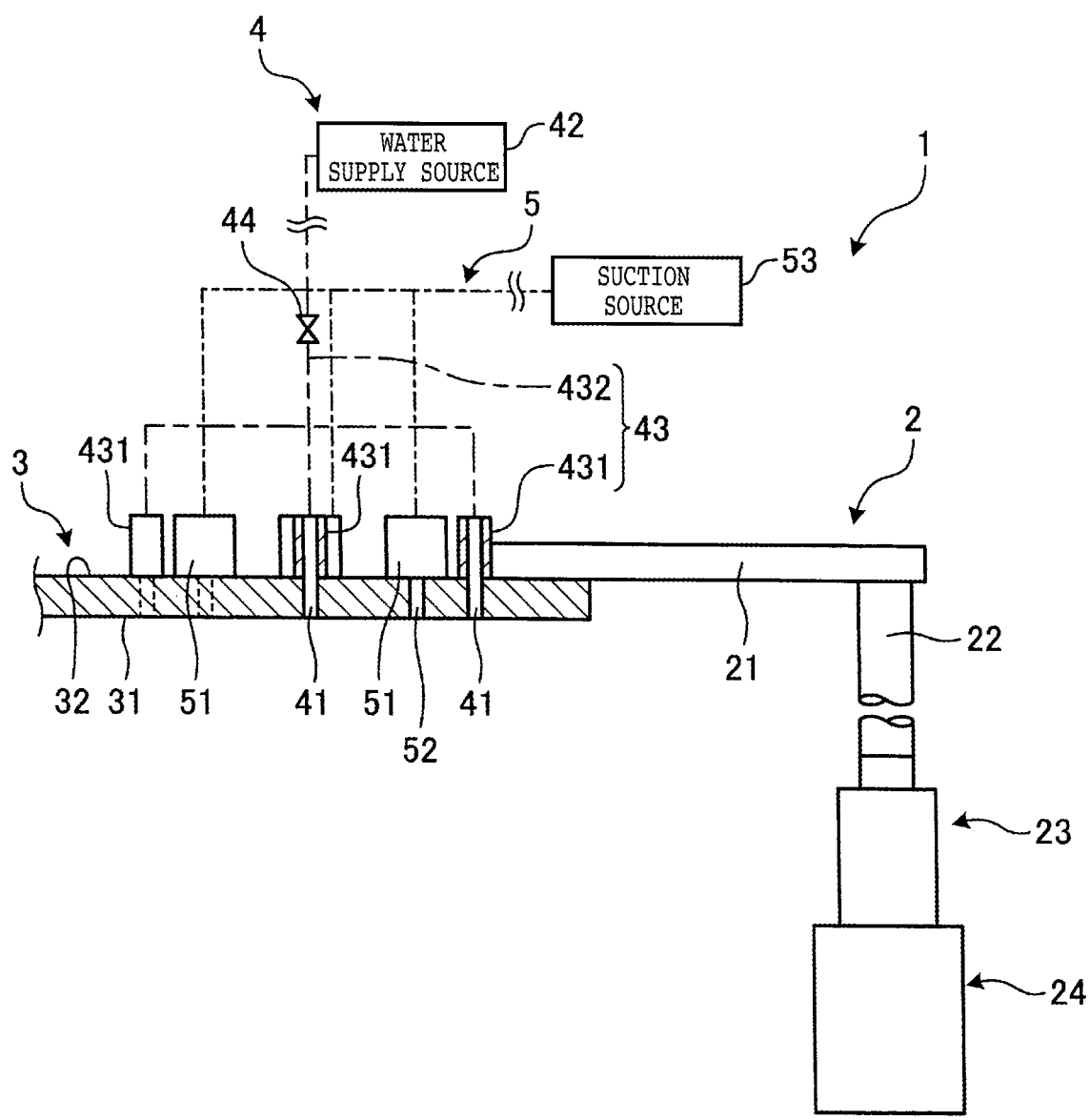
FIG. 4 is a partially sectional side view schematically illustrating a configuration example of the carrying-out unit that is the conveying apparatus according to the first embodiment.
Figure 5:
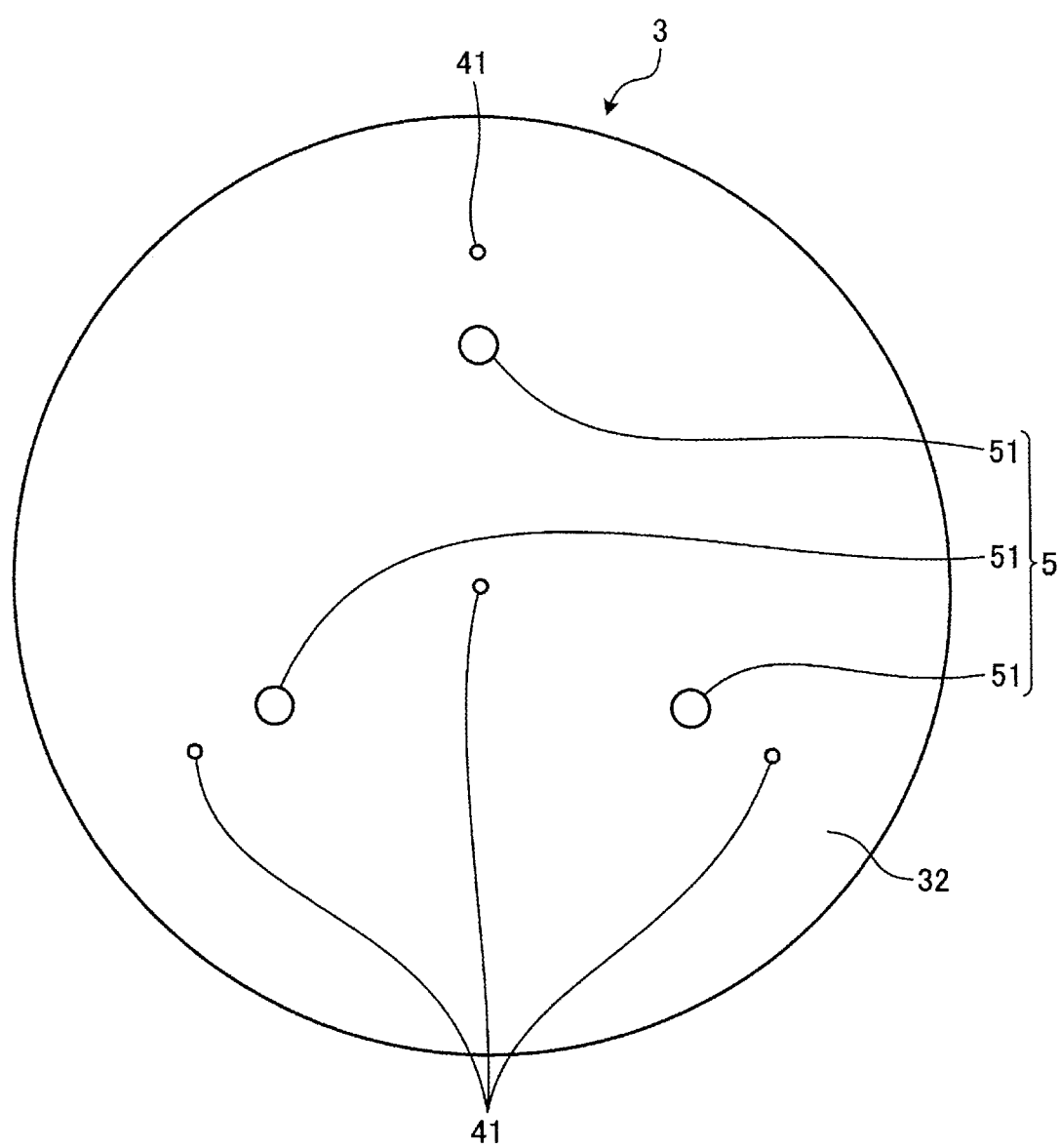
FIG. 5 is a plan view of a holding pad of the carrying-out unit illustrated in FIG. 4.
Figure 6:
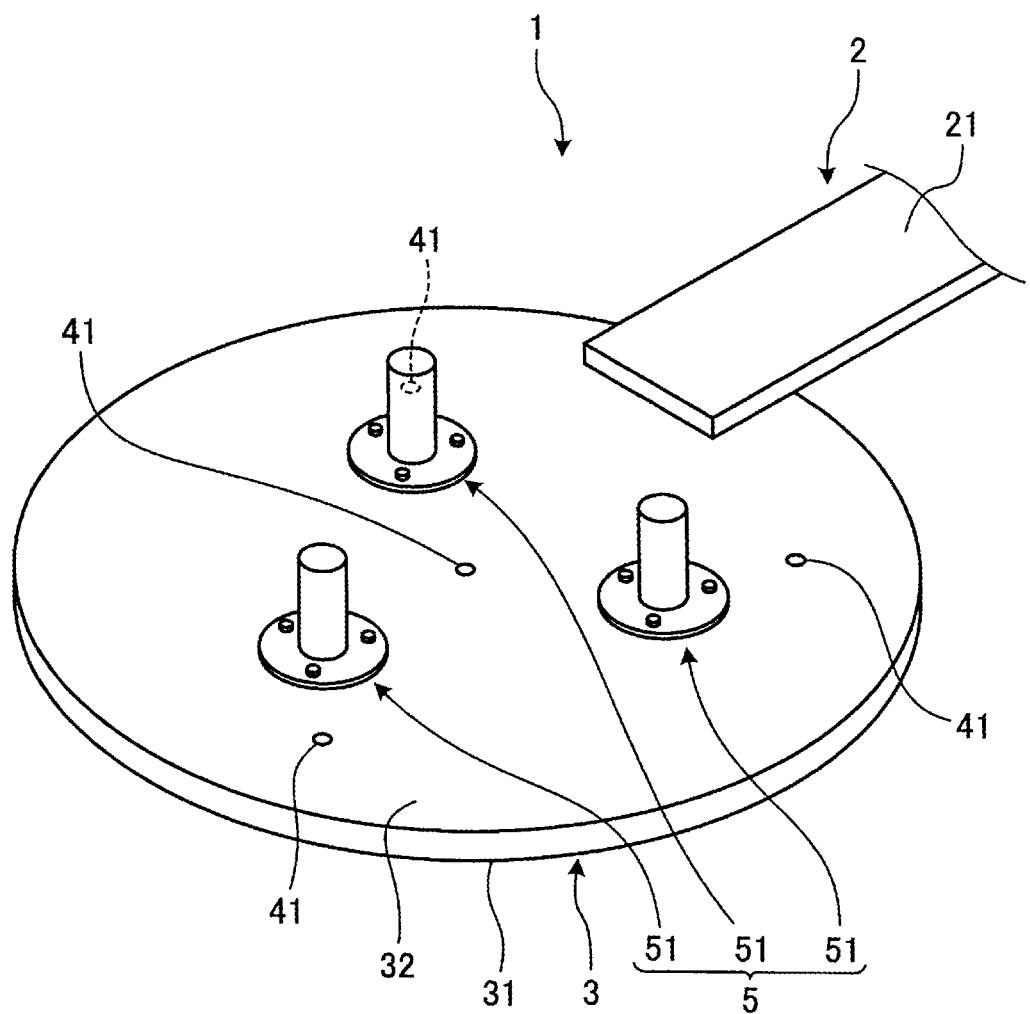
FIG. 6 is a perspective view of the holding pad of the carrying-out unit illustrated in FIG. 5.

A carrying-out unit 1 that is a conveying apparatus according to a first embodiment of the present invention will be described based on drawings. FIG. 1 is a perspective view illustrating a configuration example of a processing apparatus including the carrying-out unit that is the conveying apparatus according to the first embodiment. FIG. 2 is a perspective view illustrating a substrate of a processing target of the processing apparatus illustrated in FIG. 1. FIG. 3 is a perspective view illustrating the state after processing of the substrate illustrated in FIG. 2. FIG. 4 is a partially sectional side view schematically illustrating a configuration example of the carrying-out unit that is the conveying apparatus according to the first embodiment. FIG. 5 is a plan view of a holding pad of the carrying-out unit illustrated in FIG. 4. FIG. 6 is a perspective view of the holding pad of the carrying-out unit illustrated in FIG. 5.

(Substrate)

The carrying-out unit 1 according to the first embodiment configures a processing apparatus 100 illustrated in FIG. 1. In the first embodiment, the processing apparatus 100 is a grinding apparatus that grinds a substrate 200 illustrated in FIG. 2. The substrate 200 that is a processing target of the processing apparatus 100 illustrated in FIG. 1 is a wafer such as a circular-plate-shaped semiconductor wafer or optical device wafer containing silicon, sapphire, gallium, or the like as a base 201. As illustrated in FIG. 2, the substrate 200 includes a device region 210 and an outer circumferential surplus region 211 that surrounds the device region 210 in a front surface 202 of the base 201.

The device region 210 has planned dividing lines 203 set in a lattice manner in the front surface 202 of the base 201 and devices 204 formed in the respective regions marked out by the planned dividing lines 203.

The device 204 is, for example, a circuit such as an integrated circuit (IC) or large scale integration (LSI), an image sensor such as a charge coupled device (CCD) or complementary metal oxide semiconductor (CMOS), or micro electro mechanical systems (MEMS). The outer circumferential surplus region 211 is a region that surrounds the device region 210 across the whole circumference and in which the device 204 is not formed on the front surface 202 of the base 201.

Further, in the first embodiment, in the substrate 200, before grinding processing is executed by the processing apparatus 100, the thickness is set constant across the device region 210 and the outer circumferential surplus region 211, and the front surface 202 and a back surface 205 (equivalent to the held surface) on the back side of the front surface 202 are each formed in the same flat surface across the device region 210 and the outer circumferential surplus region 211.

Moreover, in the first embodiment, for the substrate 200, the back surface 205 of the device region 210 is ground by the processing apparatus 100. As illustrated in FIG. 3, the substrate 200 is thereby formed into what is generally called a TAIKO (registered trademark) wafer in which a circular recess part 206 (equivalent to the recess part) is formed on the side of the back surface 205 of the device region 210 and an annular protrusion part 207 (equivalent to the protrusion part) due to which the outer circumferential surplus region 211 is thicker than the device region 210 is formed. The circular recess part 206 is formed in the region that overlaps with the device region 210 in the thickness direction in the back surface 205, and the annular protrusion part 207 is formed in the region that overlaps with the outer circumferential surplus region 211 in the thickness direction in the back surface 205. In the present specification, the region that overlaps with the device region 210 in the thickness direction in the back surface 205 is referred to as the device region 210 of the back surface 205, and the region that overlaps with the outer circumferential surplus region 211 in the thickness direction in the back surface 205 is referred to as the outer circumferential surplus region 211 of the back surface 205.

As above, the back surface 205 of the substrate 200 has the circular recess part 206 formed at the center and the annular protrusion part 207 that surrounds the circular recess part 206, and a step 208 is formed between the device region 210 and the outer circumferential surplus region 211. Further, the front surface 202 of the substrate 200 is formed in the same flat surface across the device region 210 and the outer circumferential surplus region 211. A bottom surface 209 of the circular recess part 206 is a region for which treatment such as grinding processing has been executed by the processing apparatus 100.

In the first embodiment, for the substrate 200, grinding processing is executed for the back surface 205 by the processing apparatus 100, the circular recess part 206 and the annular protrusion part 207 are formed, and a film composed of metal is formed on the bottom surface 209 of the circular recess part 206 by plating or the like. After the film composed of the metal is formed on the bottom surface 209 of the circular recess part 206, the substrate 200 is divided into the individual devices 204 along the planned dividing lines 203. In addition, the substrate 200 is cut along the outer edge of the circular recess part 206, and the device region 210 and the outer circumferential surplus region 211 are separated, that is, the circular recess part 206 and the annular protrusion part 207 are separated.

(Processing Apparatus)

Next, the processing apparatus 100 will be described. The processing apparatus 100 is a grinding apparatus that grinds the back surface of the substrate 200 and thins the substrate 200 to a predetermined finished thickness. As illustrated in FIG. 1, the processing apparatus 100 includes an apparatus main body 101, a rough grinding unit 102, a finish grinding unit 103, grinding feed units 104, a turntable 105, plural (in the first embodiment, three) holding tables 106 set on the turntable 105, cassettes 107, a position adjustment unit 108, a carrying-in unit 109, a cleaning unit 110, a carrying-out/in unit 111, a control unit 112, and the carrying-out unit 1 that is the conveying apparatus.

The turntable 105 is a circular-disc-shaped table disposed on the upper surface of the apparatus main body 101, is disposed rotatably in the horizontal plane around the axial center parallel to a Z-axis direction, and is rotationally driven at a predetermined timing. On the turntable 105, for example, the three holding tables 106 are disposed at equal intervals with a phase angle of, for example, 120 degrees. The three holding tables 106 are what have a holding table structure including a vacuum chuck having a holding surface connected to a suction source that is not illustrated in the diagram. The side of the front surface 202 of the substrate 200 is placed on the holding surface and is sucked by the suction source, so that the substrate 200 is held under suction on the holding surface.

At the time of grinding processing, the holding tables 106 are rotationally driven in the horizontal plane by a rotational drive mechanism around the axial center parallel to the vertical direction, i.e. the Z-axis direction. The holding tables 106 are sequentially moved to a carrying-in/out region 301, a rough grinding region 302, a finish grinding region 303, and the carrying-in/out region 301 by rotation of the turntable 105.

The carrying-in/out region 301 is a region in which the substrate 200 is carried in to and carried out from the holding table 106. The rough grinding region 302 is a region in which rough grinding (equivalent to the grinding) of the substrate 200 held by the holding table 106 is executed by the rough grinding unit 102. The finish grinding region 303 is a region in which finish grinding (equivalent to the grinding) of the substrate 200 held by the holding table 106 is executed by the finish grinding unit 103.

The rough grinding unit 102 is a grinding unit on which a grinding wheel 114 for rough grinding on which grinding abrasive stones 113 for rough grinding with which rough grinding of the device region 210 of the back surface 205 exposed upward in the substrate 200 held by the holding table 106 is executed are annularly disposed is mounted, the rough grinding unit 102 executing rough grinding of the device region 210 of the back surface 205 of the substrate 200 held by the holding surface of the holding table 106 in the rough grinding region 302. The finish grinding unit 103 is a grinding unit on which a grinding wheel 116 for finish grinding on which grinding abrasive stones 115 for finish grinding with which finish grinding of the device region 210 of the back surface 205 of the substrate 200 held by the holding table 106 is executed are annularly disposed is mounted, the finish grinding unit 103 executing finish grinding of the device region 210 of the back surface 205 of the substrate 200 held by the holding surface of the holding table 106 in the finish grinding region 303.

In the grinding units 102 and 103, the grinding wheel 114 or 116 is rotated around the axial center by a motor 118. In addition, while grinding water is supplied to the back surface of the substrate 200 held by the holding table 106 in the grinding region 302 or 303, the grinding abrasive stones 113 or 115 are brought closer to the holding table 106 at a predetermined feed rate by the grinding feed unit 104. Rough grinding or finish grinding of the device region 210 of the back surface 205 of the substrate 200 is thereby executed to form the circular recess part 206 and the annular protrusion part 207 in the back surface 205.

The grinding feed units 104 are what move the grinding units 102 and 103 in the Z-axis direction to cause the grinding units 102 and 103 to get further away from and closer to the holding table 106. In the first embodiment, the grinding feed units 104 are disposed on an upright-disposed column 117 disposed upright from one end part of the apparatus main body 101 in a Y-axis direction parallel to the horizontal direction. The grinding feed units 104 include a well-known ball screw disposed rotatably around the axial center, a well-known motor that rotates the ball screw around the axial center, and well-known guide rails that support a spindle housing of the grinding unit 102 or 103 movably in the Z-axis direction.

In the first embodiment, in the rough grinding unit 102 and the finish grinding unit 103, the axial center that is the rotation center of the grinding wheel 114 or 116 and the axial center that is the rotation center of the holding table 106 are disposed in parallel at an interval from each other in the horizontal direction, and the grinding abrasive stones 113 or 115 pass over the center of the back surface of the substrate 200 held by the holding table 106.

The cassettes 107 are housing containers that have plural slots and are for housing the plural substrates 200. The cassettes 107 house the plural substrates 200 that have not yet been undergone grinding processing and the substrates 200 that have undergone grinding processing as illustrated in FIG. 1. In the first embodiment, a pair of cassettes 107 are disposed and are each set on a cassette setting pedestal. The cassette setting pedestal raises and lowers the cassette 107 in the Z-axis direction. The position adjustment unit 108 is a table for allowing the substrate 200 taken out from the cassette 107 to be temporarily placed thereon and executing center position adjustment of the substrate 200.

The carrying-in unit 109 has a suction adhesion pad that causes suction adhesion of the substrate 200. The carrying-in unit 109 holds, by suction adhesion, the substrate 200 that has not yet undergone grinding processing for which position adjustment has been executed by the position adjustment unit 108, and carries in the substrate 200 onto the holding table 106 located in the carrying-in/out region 301. The cleaning unit 110 cleans the substrate 200 that has been ground and removes contamination such as grinding dust that adheres to the ground back surface.

The carrying-out/in unit 111 takes out the substrate 200 that has not yet undergone grinding processing from the cassette 107 and conveys the substrate 200 to the position adjustment unit 108. In addition, the carrying-out/in unit 111 takes out the substrate 200 that has undergone grinding processing from the cleaning unit 110 and conveys the substrate 200 to the cassette 107. The carrying-out/in unit 111 is a robot pick including a U-shaped hand 119, for example, and holds the substrate 200 by suction adhesion and conveys it by the U-shaped hand 119.

The control unit 112 is what controls each of the above-described constituent units that configure the processing apparatus 100. That is, the control unit 112 is what causes the processing apparatus 100 to execute processing operation for the substrate 200. The control unit 112 is a computer having a calculation processing device having a microprocessor such as a central processing unit (CPU), a storing device having a memory such as a read only memory (ROM) or a random access memory (RAM), and an input-output interface device.

The calculation processing device of the control unit 112 executes calculation processing according to a computer program stored in the storing device and outputs a control signal for controlling the processing apparatus 100 to the above-described constituent elements of the processing apparatus 100 through the input-output interface device. Further, the control unit 112 is connected to a display unit configured by a liquid crystal display device or the like that displays the state of processing operation, an image, and so forth, an input unit used when an operator registers information on the contents of processing or the like, and an informing unit that executes informing to the operator. The input unit is configured by at least one of a touch panel disposed in the display unit, a keyboard, and so forth. The informing unit issues at least any of sound, light, and a message on the touch panel to execute informing to the operator.

(Carrying-Out Unit)

In the first embodiment, the carrying-out unit 1 is what holds under suction the back surface 205 that is the region for which treatment has been executed in the substrate 200 that has undergone grinding processing on the holding surface of the holding table 106 located in the carrying-in/out region 301 and conveys the substrate 200 to the cleaning unit 110. As illustrated in FIG. 4, the carrying-out unit 1 includes a movement unit 2, a holding pad 3, a water supply unit 4, and a suction unit 5.

The movement unit 2 is what moves the holding pad 3 in an X-axis direction that is illustrated in FIG. 1 and is parallel to the horizontal direction, the Y-axis direction that is parallel to the horizontal direction and is orthogonal to the X-axis direction, and the Z-axis direction that is orthogonal to both the X-axis direction and the Y-axis direction and is parallel to the vertical direction. In the first embodiment, the movement unit 2 is what causes the holding pad 3 to move in such a direction as to get closer to or further away from the substrate 200 held by the holding table 106 located in the carrying-in/out region 301. The movement unit 2 moves the holding pad 3 along the Z-axis direction to thereby cause the holding pad 3 to move in such a direction as to get closer to or further away from the substrate 200 held by the holding table 106 located in the carrying-in/out region 301. In addition, the movement unit 2 moves the holding pad 3 along the horizontal direction from the holding table 106 located in the carrying-in/out region 301 toward the cleaning unit 110.

In the first embodiment, as illustrated in FIG. 4, the movement unit 2 includes a conveying arm 21 (equivalent to the arm) having one end part to which the holding pad 3 is attached, a pivot shaft 22 that has an upper end part attached to the other end part of the conveying arm 21 and is parallel to the Z-axis direction, a raising-lowering unit 23 that is coupled to the lower end of the pivot shaft 22 and raises and lowers the conveying arm 21, and a turning unit 24 that rotates the raising-lowering unit 23 around the axial center parallel to the Z-axis direction. The conveying arm 21 is formed of an appropriate metal material, and the one end part thereof is attached to the holding pad 3 by, for example, a fastening bolt that is not illustrated in the diagram.

The raising-lowering unit 23 is formed of, for example, an air cylinder or the like, is coupled to the pivot shaft 22 attached to the other end part of the conveying arm 21, and raises and lowers the conveying arm 21 along the Z-axis direction through the pivot shaft 22. The turning unit 24 includes a pulse motor capable of forward rotation and reverse rotation and turns the conveying arm 21 around the pivot shaft 22 through the raising-lowering unit 23 and the pivot shaft 22. Therefore, the raising-lowering unit 23 and the turning unit 24 can position the holding pad 3 attached to the one end part of the conveying arm 21 to the upper side of the back surface 205 of the substrate 200 placed on the holding surface of the holding table 106 located in the carrying-in/out region 301.

As illustrated in FIG. 5 and FIG. 6, the holding pad 3 is formed into a thick circular plate shape whose outer diameter is equal to or larger than that of the substrate 200. In the first embodiment, the outer diameter of the holding pad 3 is equal to that of the substrate 200. However, the outer diameter of the holding pad 3 may be set larger than that of the substrate 200. When the outer diameter of the holding pad 3 is larger than that of the substrate 200, there is an effect that a space 220 between the holding pad 3 and the back surface 205 that is the held surface is easily sealed and the holding force can be exerted even when the position of the holding pad 3 relative to the substrate 200 deviates in positioning of the holding pad 3. The holding pad 3 is formed to have a constant thickness and is composed of hard resin such as polyether ether ketone (PEEK) in the first embodiment. In the present invention, the holding pad 3 may be composed of a material with high hydrophilicity, such as titanium oxide, glass, or aluminum, for example.

Further, the holding pad 3 includes a holding surface 31 that is opposed to the back surface 205 of the substrate 200 on the holding surface of the holding table 106 located in the carrying-in/out region 301 and that holds the back surface 205 of the substrate 200 to convey the substrate 200. In the first embodiment, the holding surface 31 is the lower surface of the holding pad 3. When getting contact with the upper surface of the annular protrusion part 207 of the substrate 200, the holding surface 31 of the holding pad 3 keeps the boundary with the upper surface of the annular protrusion part 207 liquid-tight. In the present invention, in the holding pad 3, the holding surface 31 may be coated with resin having elasticity, such as rubber, to allow the boundary with the back surface 205 of the substrate 200 to be kept more liquid-tight. Because the holding pad 3 has the holding surface 31 that holds the back surface 205 of the substrate 200 as described above, the back surface 205 of the substrate 200 is the held surface held by the holding pad 3 of the substrate 200.

The holding pad 3 is also what is positioned above the back surface 205 of the substrate 200 on the holding surface of the holding table 106 located in the carrying-in/out region 301 by the movement unit 2 and then is lowered and gets contact with the upper surface of the annular protrusion part 207 that is the outer circumferential part of the back surface 205 of the substrate 200 on the holding surface of the holding table 106, to form the space 220 (illustrated in FIG. 9) to be filled with water 6 (illustrated in FIG. 10) between the holding pad 3 and the bottom surface 209 of the circular recess part 206 that is part of the back surface 205 of the substrate 200.

The water supply unit 4 is what supplies the water 6 to the above-described space 220. As illustrated in FIG. 4, the water supply unit 4 includes supply holes 41, a water supply source 42, a supply pipe 43, and an opening-closing valve 44. The supply holes 41 are holes that penetrate the holding pad 3 in the Z-axis direction. In the first embodiment, as illustrated in FIG. 5, the supply hole 41 is made at the center of the holding pad 3, and plural (in the first embodiment, three) supply holes 41 are made at an outer edge part of the holding pad 3 at intervals in the circumferential direction.

The water supply source 42 is what supplies the water 6 (in the first embodiment, purified water) to the above-described space 220 through the supply holes 41 and so forth. The supply pipe 43 is a cylindrical pipe and is composed of resin or the like having flexibility in the first embodiment. In the first embodiment, the supply pipe 43 includes plural branch pipes 431 that each have one end connected to a corresponding one of the supply holes 41 and have the other ends coupled to each other and one main pipe 432 connected to the other ends of the plural branch pipes 431 and to the water supply source 42. In the first embodiment, the one ends of the branch pipes 431 of the supply pipe 43 are attached to an upper surface 32 on the back side of the holding surface 31 of the holding pad 3.

The opening-closing valve 44 is disposed on the main pipe 432, and supplies the water 6 from the water supply source 42 to the space 220 when being opened and stops the supply of the water 6 from the water supply source 42 to the space 220 when being closed. The water supply unit 4 fills the space 220 with the water 6 in the state in which the holding surface 31 of the holding pad 3 is in contact with the annular protrusion part 207 of the substrate 200. This causes the substrate 200 to be held on the holding surface 31 of the holding pad 3 by the surface tension of the water 6 with which the space 220 is filled, without contact of the holding surface 31 with the bottom surface 209 of the circular recess part 206.

The suction unit 5 is what sucks the water 6 with which the space 220 is filled, and improves the force of holding the substrate 200. The suction unit 5 includes a suction pump 51 including an opening-closing valve for suction of a certain amount of water. The suction pump 51 including the opening-closing valve for suction of the certain amount of water is what is connected to a suction source 53 and is connected to the space 220 through a through-hole 52 that penetrates the holding pad 3 and sucks the water 6 with which the inside of the space 220 is filled. In the first embodiment, the suction pump 51 including the opening-closing valve for suction of the certain amount of water is what is generally called a constant delivery pump (referred to also as a suck valve) that sucks a predetermined amount of water 6 defined in advance from the inside of the space 220 by being sucked by the suction source 53 and stops the suction of the water 6 when having sucked the predetermined amount of water 6 from the space 220. The substrate 200 bends if the water 6 with which the space 220 is filled is excessively sucked. Thus, the suction pump 51 suitable for the size of the substrate 200 and the depth and the diameter of the circular recess part 206 needs to be selected.

In the first embodiment, the suction pump 51 is attached to the upper surface 32 of the holding pad 3. In the first embodiment, as illustrated in FIG. 5 and FIG. 6, the suction pump 51 is disposed between the center of the upper surface 32 of the holding pad 3 and the supply hole 41 made at the outer edge part, and plural (in the first embodiment, three) suction pumps 51 are disposed at intervals in the circumferential direction of the holding pad 3. That is, in the first embodiment, the suction unit 5 includes the plural (in the first embodiment, three) suction pumps 51. Because the suction unit 5 includes the plural suction pumps 51 with the interposition of intervals, the water 6 is sucked at plural places evenly. Therefore, there is an effect that the substrate 200 is attracted to the holding pad 3 with the minimum possibility that the substrate 200 is sucked with a bias toward part of the substrate 200 when the water 6 is sucked.

(Conveying Method of Substrate)

Figure 7:
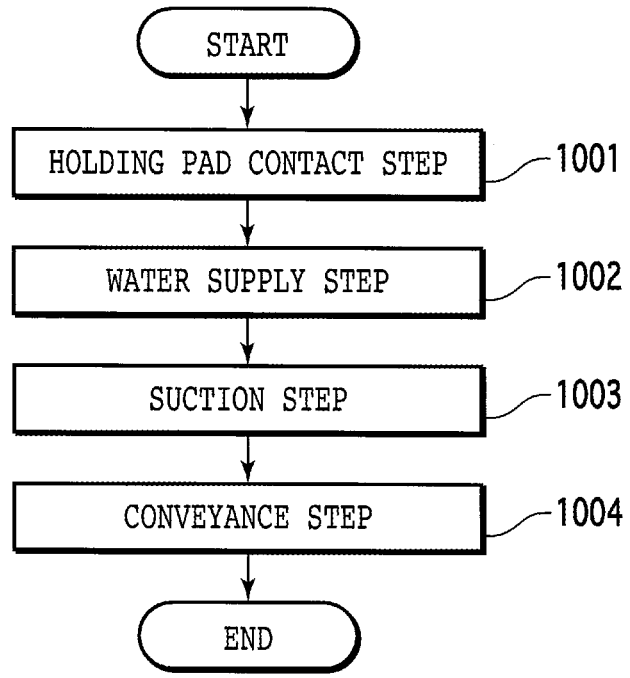
FIG. 7 is a flowchart illustrating the flow of a conveying method of a substrate according to the first embodiment.

Next, a conveying method of a substrate according to the first embodiment will be described. FIG. 7 is a flowchart illustrating the flow of the conveying method of a substrate according to the first embodiment. The conveying method of a substrate is a method in which the back surface 205 of the substrate 200 is held by the holding surface 31 of the holding pad 3 and the substrate 200 is conveyed. In the first embodiment, the conveying method of a substrate is a method in which the above-described carrying-out unit 1 holds the back surface 205 of the substrate 200 that has undergone grinding processing on the holding surface of the holding table 106 located in the carrying-in/out region 301 by the holding surface 31 of the holding pad 3 and conveys the substrate 200 to the cleaning unit 110.

As illustrated in FIG. 7, the conveying method of a substrate according to the first embodiment includes a holding pad contact step 1001, a water supply step 1002, a suction step 1003, and a conveyance step 1004.

(Holding Pad Contact Step)

Figure 8:
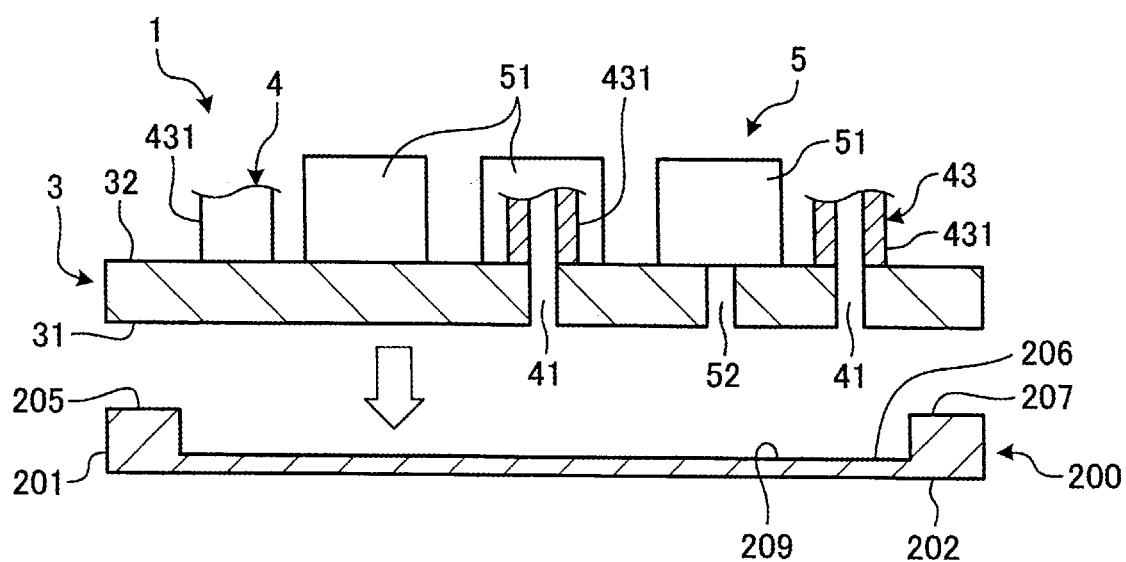
FIG. 8 is a sectional view schematically illustrating the state in which the holding pad is positioned above the substrate in a holding pad contact step in the conveying method of a substrate illustrated in FIG. 7.
Figure 9:
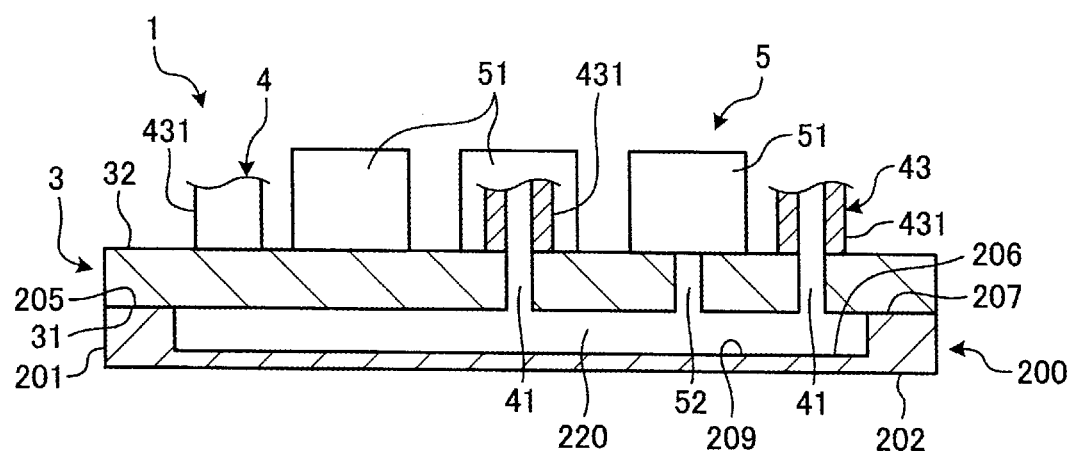
FIG. 9 is a sectional view schematically illustrating the state in which the holding pad illustrated in FIG. 8 is lowered and brought into contact with an annular protrusion part of the substrate.

FIG. 8 is a sectional view schematically illustrating the state in which the holding pad is positioned above the substrate in the holding pad contact step in the conveying method of a substrate illustrated in FIG. 7. FIG. 9 is a sectional view schematically illustrating the state in which the holding pad illustrated in FIG. 8 is lowered and is brought into contact with the annular protrusion part of the substrate. The holding pad contact step 1001 is a step of bringing the annular protrusion part 207 of the back surface 205 of the substrate 200 into contact with the holding surface 31 of the holding pad 3 and forming the space 220 to be filled with the water 6.

In the holding pad contact step 1001, the control unit 112 stops holding the holding table 106 under suction that is located in the carrying-in/out region 301 and that holds the substrate 200 for which grinding processing has been executed. In the holding pad contact step 1001, the control unit 112 controls the movement unit 2 of the carrying-out unit 1 to raise the holding pad 3 and, as illustrated in FIG. 8, position the holding pad 3 in the raised state above the substrate 200 on the holding surface of the holding table 106 located in the carrying-in/out region.

In the holding pad contact step 1001, the control unit 112 controls the movement unit 2 of the carrying-out unit 1 to lower the holding pad 3 and, as illustrated in FIG. 9, bring the holding surface 31 of the holding pad 3 into contact with the annular protrusion part 207 of the substrate 200 on the holding surface of the holding table 106 located in the carrying-in/out region, to form the above-described space 220 with the boundary between the holding surface 31 of the holding pad 3 and the upper surface of the annular protrusion part 207 of the substrate 200 kept liquid-tight.

(Water Supply Step)

Figure 10:
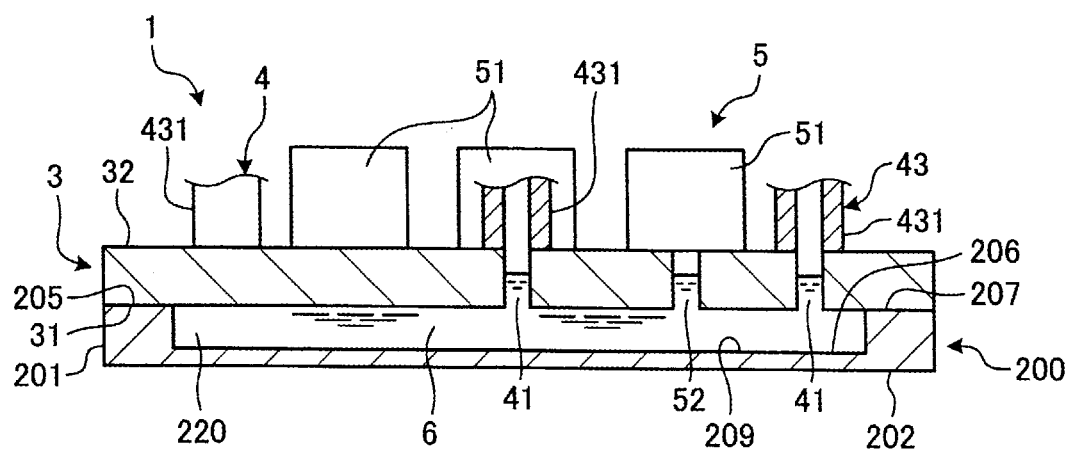
FIG. 10 is a sectional view schematically illustrating a water supply step in the conveying method of a substrate illustrated in FIG. 7.

FIG. 10 is a sectional view schematically illustrating the water supply step in the conveying method of a substrate illustrated in FIG. 7. The water supply step 1002 is a step of supplying the water 6 to the back surface 205 of the substrate 200. In the first embodiment, the water supply step 1002 is a step of filling the space 220 with the water 6 after the holding pad contact step 1001.

In the first embodiment, in the water supply step 1002, the control unit 112 opens the opening-closing valve 44 to fill the space 220 formed between the bottom surface 209 of the circular recess part 206 of the back surface 205 and the holding surface 31 of the holding pad 3 with the water 6 as illustrated in FIG. 10. In the first embodiment, in the water supply step 1002, the control unit 112 closes the opening-closing valve 44 when the inside of the space 220 has been filled with the water 6. Thereupon, the substrate 200 is held by the holding pad 3 due to the surface tension of the water 6 with which the inside of the space 220 is filled.

(Suction Step)

Figure 11:
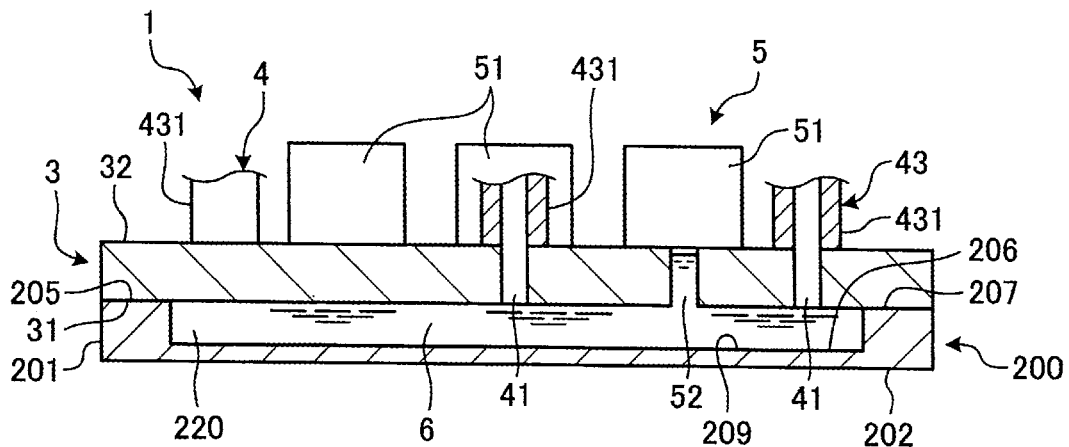
FIG. 11 is a sectional view schematically illustrating a suction step in the conveying method of a substrate illustrated in FIG. 7.

FIG. 11 is a sectional view schematically illustrating the suction step in the conveying method of a substrate illustrated in FIG. 7. The suction step 1003 is a step of sucking the water 6 with which the space 220 is filled and improving the force with which the holding pad 3 holds the substrate 200.

In the suction step 1003, the control unit 112 drives the suction pumps 51, causes each suction pump 51 to suck the predetermined amount of water 6 with which the inside of the space 220 is filled, and causes the water supply source 42 to discharge this water 6. Thereupon, the pressure of the water 6 with which the inside of the space 220 is filled becomes lower than the pressure of the outside of the space 220, and the substrate 200 is pressed against the holding surface 31 of the holding pad 3 due to the pressure difference between the inside and the outside of the space 220. Due to this, the holding surface 31 of the holding pad 3 and the upper surface of the annular protrusion part 207 of the substrate 200 get close contact with each other, so that the force with which the holding pad 3 holds the substrate 200 improves.

(Conveyance Step)

Figure 12:
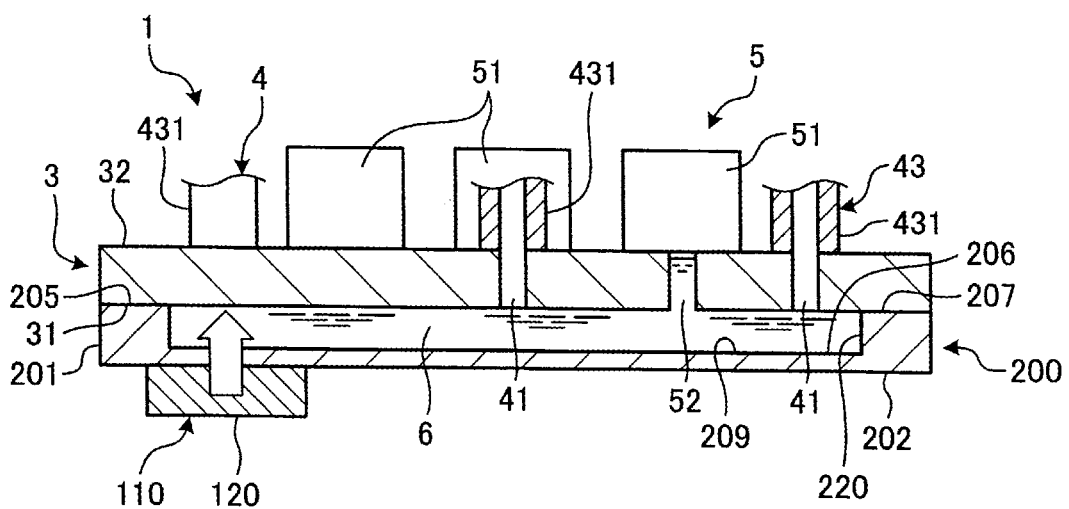
FIG. 12 is a sectional view schematically illustrating the substrate and so forth that have undergone a conveyance step in the conveying method of a substrate illustrated in FIG. 7.

FIG. 12 is a sectional view schematically illustrating the substrate and so forth that have undergone the conveyance step in the conveying method of a substrate illustrated in FIG. 7. The conveyance step 1004 is a step of conveying the substrate 200 held on the holding surface 31 of the holding pad 3 after the suction step 1003.

In the first embodiment, in the conveyance step 1004, the control unit 112 controls the movement unit 2 to raise the holding pad 3 and then rotate the conveying arm 21 around the pivot shaft 22, so that the carrying-out unit 1 conveys the substrate 200 held by the holding pad 3 to the cleaning unit 110. In this manner, the carrying-out unit 1 holds the substrate 200 by the holding pad 3 and conveys it through the water 6 with which the inside of the space 220 is filled. Thus, the carrying-out unit 1 can convey the substrate 200 without contact of the holding pad 3 with the bottom surface 209 of the circular recess part 206 of the substrate 200, and scratching of the bottom surface 209 of the circular recess part 206 of the substrate 200 and adhesion of a foreign matter thereto can be suppressed. Thus, the carrying-out unit 1 can suppress lowering of the flexural strength of the device 204 due to scratching of the bottom surface 209 of the circular recess part 206 of the substrate 200.

Further, in the first embodiment, for the substrate 200 conveyed to the cleaning unit 110, a cleaning brush 120 that rotates around the holding pad 3 gets contact with the front surface 202 as illustrated in FIG. 12, and the front surface 202 and so forth are cleaned by the cleaning unit 110. The substrate 200 that has been cleaned is conveyed to the cassette 107 by the carrying-out/in unit 111 and is housed in the cassette 107.

As described above, the carrying-out unit 1 according to the first embodiment holds the substrate 200 on the holding pad 3 by the surface tension of the water 6 with which the inside of the space 220 is filled and conveys the substrate 200. In addition, the carrying-out unit 1 includes the suction pumps 51 that suck the water 6 with which the inside of the space 220 is filled and improve the force with which the holding pad 3 holds the substrate 200. Therefore, the substrate 200 can be held and conveyed with the annular protrusion part 207 of the back surface 205 of the substrate 200 brought into tight contact with the holding surface 31 of the holding pad 3. Further, because holding the substrate 200 on the holding pad 3 by the surface tension of the water 6 with which the inside of the space 220 is filled and conveying the substrate 200, the carrying-out unit 1 according to the first embodiment can convey the substrate 200 without contact of the holding surface 31 of the holding pad 3 with the bottom surface 209 of the circular recess part 206 of the substrate 200.

As a result, the carrying-out unit 1 according to the first embodiment provides an effect that the substrate 200 can be conveyed without direct contact with the bottom surface 209 of the circular recess part 206 for which treatment such as grinding processing has been executed, while the holding force is improved.

Moreover, the carrying-out unit 1 according to the first embodiment holds the substrate 200 on the holding pad 3 by the surface tension of the water 6 with which the inside of the space 220 is filled and conveys the substrate 200. Further, the carrying-out unit 1 according to the first embodiment includes the suction pumps 51 that suck the water 6 with which the inside of the space 220 is filled and improve the force with which the holding pad 3 holds the substrate 200. Therefore, a force that presses the substrate 200 against the holding pad 3 by the atmospheric pressure is generated through causing the pressure of the inside of the space 220 to be a negative pressure relative to the atmospheric pressure by the suction, and the holding force of holding the substrate 200 can be improved compared with the holding force of contactless conveyance by the Bernoulli effect.

As a result, the carrying-out unit 1 according to the first embodiment provides an effect that the holding force is improved compared with the holding force of contactless conveyance by the Bernoulli effect and the substrate 200 can be conveyed without direct contact with the bottom surface 209 of the circular recess part 206 for which treatment such as grinding processing has been executed.

Further, because the carrying-out unit 1 according to the first embodiment can improve the holding force of holding the substrate 200 compared with the holding force of contactless conveyance by the Bernoulli effect, rotation of the substrate 200 together with the cleaning brush 120 in a dragged manner can be suppressed even when the cleaning brush 120 is brought into contact with the front surface 202 of the substrate 200 and the front surface 202 of the substrate 200 is cleaned. Because the carrying-out unit 1 according to the first embodiment brings the annular protrusion part 207 into close contact with the holding surface 31 of the holding pad 3 and holds the substrate 200, inhibition of the cleaning operation of the cleaning brush 120 by the holding pad 3 can be suppressed. In addition, because the space between the holding pad 3 and the substrate 200 is filled with the water 6, the possibility that the substrate 200 bends or breaks is reduced even when the cleaning brush 120 is pressed against the substrate 200.

The conveying method of a substrate according to the first embodiment provides an effect that the substrate 200 can be conveyed without direct contact with the bottom surface 209 of the circular recess part 206 for which treatment such as grinding processing has been executed while the holding force is improved, because the above-described carrying-out unit 1 conveys the substrate 200.

Second Embodiment

Figure 13:
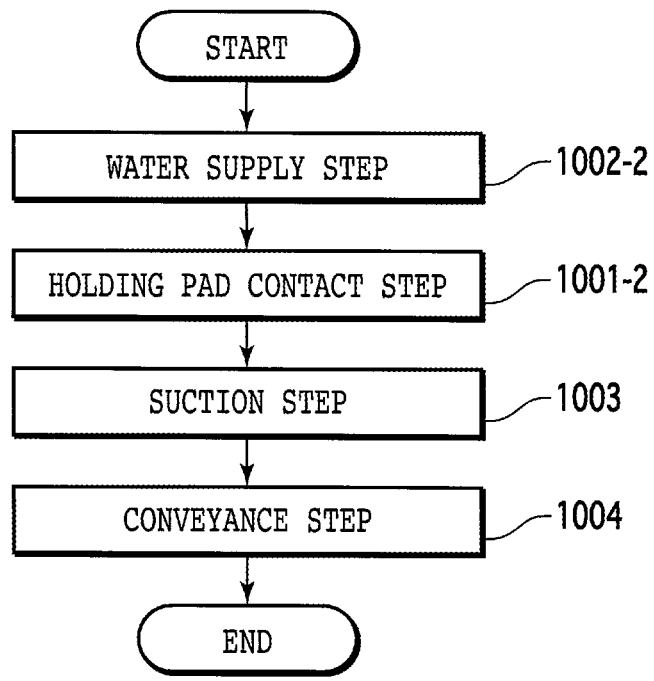
FIG. 13 is a flowchart illustrating the flow of a conveying method of a substrate according to a second embodiment.
Figure 14:
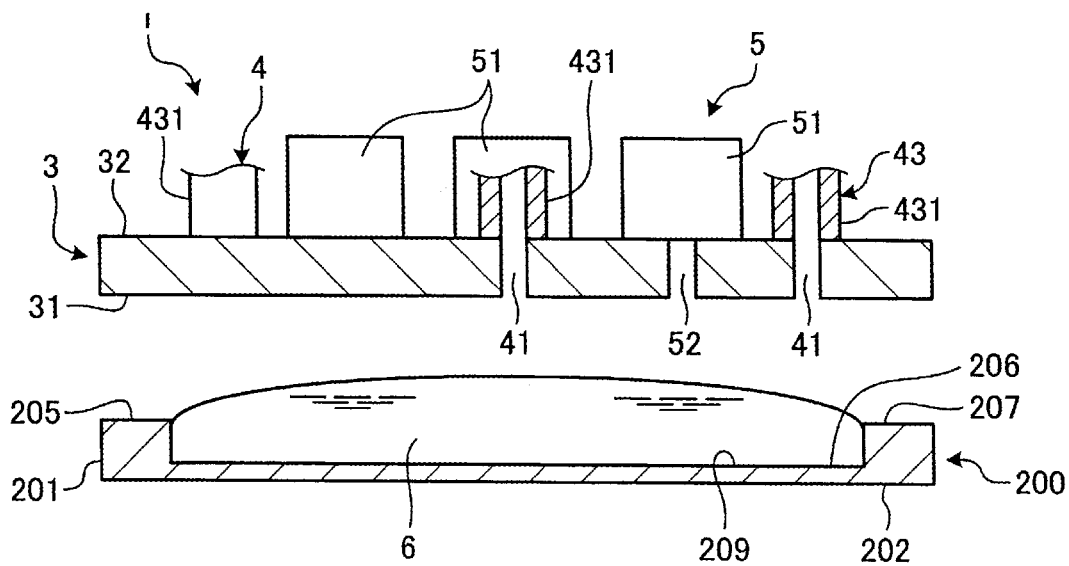
FIG. 14 is a sectional view schematically illustrating a water supply step in the conveying method of a substrate illustrated in FIG. 13.
Figure 15:
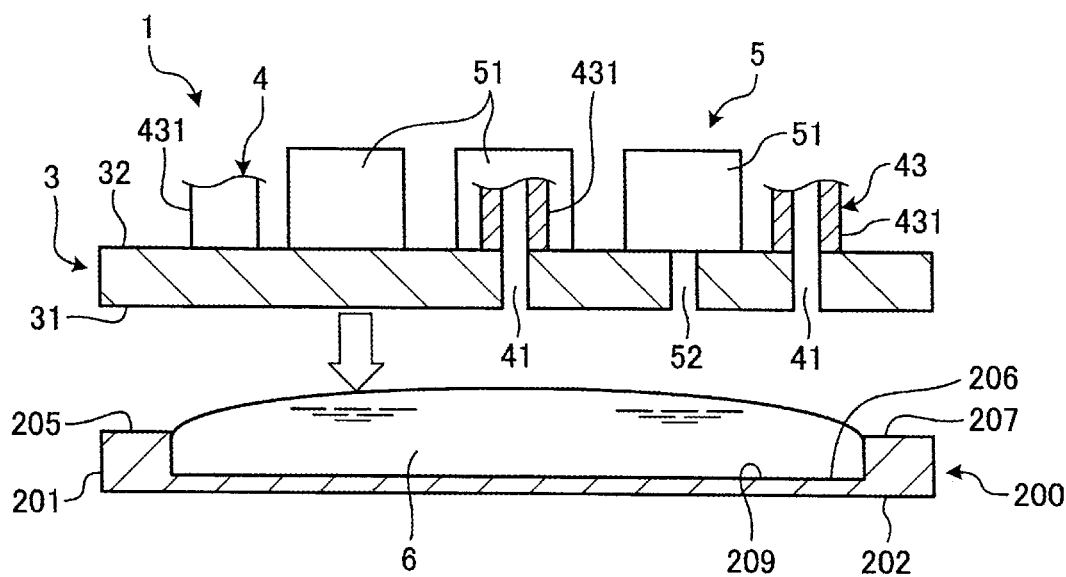
FIG. 15 is a sectional view schematically illustrating the state in which the holding pad positioned above the substrate is lowered in a holding pad contact step in the conveying method of a substrate illustrated in FIG. 13.
Figure 16:
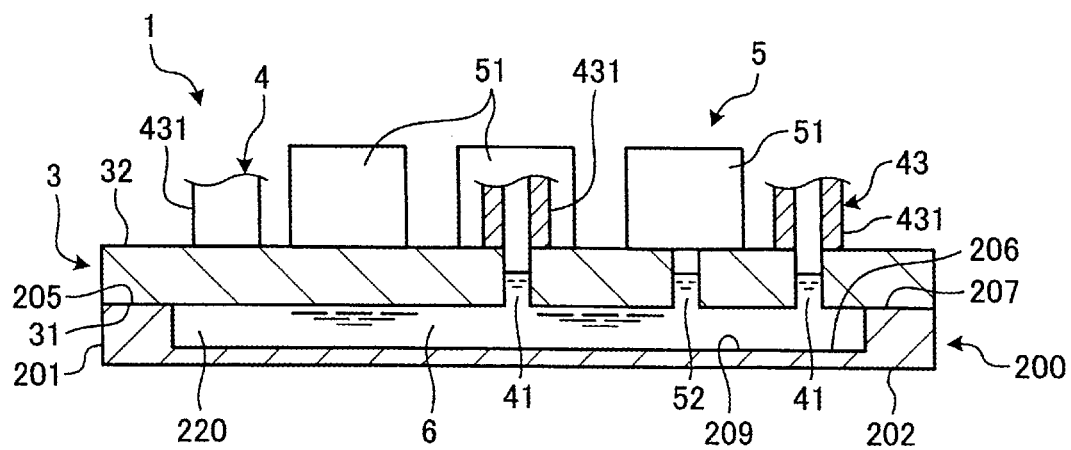
FIG. 16 is a sectional view schematically illustrating the state in which the holding pad illustrated in FIG. 15 is lowered and brought into contact with the annular protrusion part of the substrate.
Figure 17:
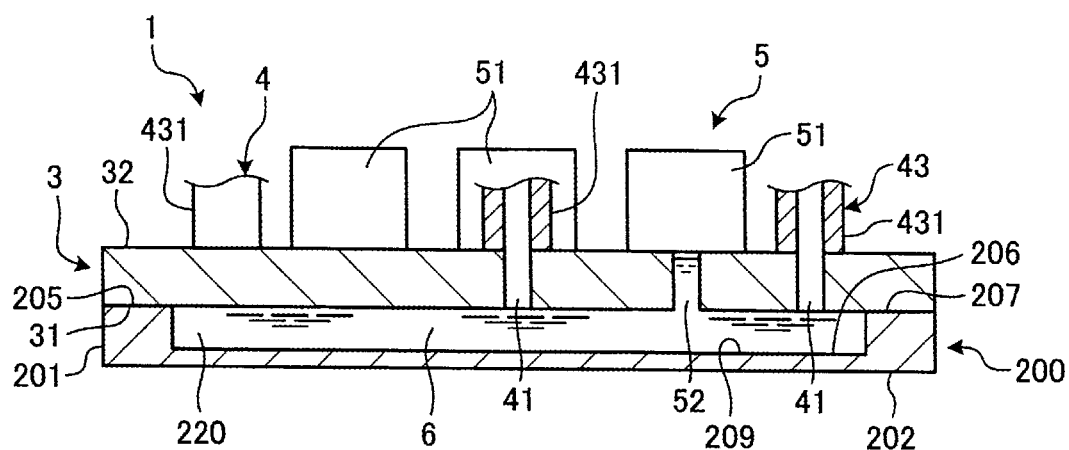
FIG. 17 is a sectional view schematically illustrating a suction step in the conveying method of a substrate illustrated in FIG. 13.
Figure 18:
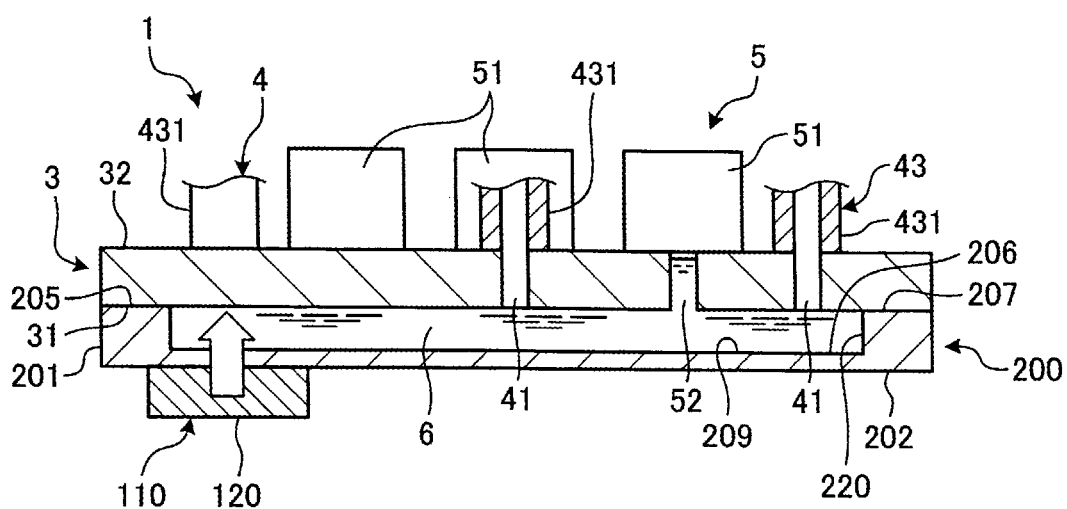
FIG. 18 is a sectional view schematically illustrating the substrate and so forth that have undergone a conveyance step in the conveying method of a substrate illustrated in FIG. 13.

A conveying method of a substrate according to a second embodiment of the present invention will be described based on drawings. FIG. 13 is a flowchart illustrating the flow of the conveying method of a substrate according to the second embodiment. FIG. 14 is a sectional view schematically illustrating a water supply step in the conveying method of a substrate illustrated in FIG. 13. FIG. 15 is a sectional view schematically illustrating the state in which the holding pad positioned above the substrate is lowered in a holding pad contact step in the conveying method of a substrate illustrated in FIG. 13. FIG. 16 is a sectional view schematically illustrating the state in which the holding pad illustrated in FIG. 15 is lowered and the holding pad is brought into contact with the annular protrusion part of the substrate. FIG. 17 is a sectional view schematically illustrating a suction step in the conveying method of a substrate illustrated in FIG. 13. FIG. 18 is a sectional view schematically illustrating the substrate and so forth that have undergone a conveyance step in the conveying method of a substrate illustrated in FIG. 13. In FIG. 13, FIG. 14, FIG. 15, FIG. 16, FIG. 17, and FIG. 18, the part same as that of the first embodiment is given the same numeral and description thereof is omitted.

In the second embodiment, the conveying method of a substrate is a method in which, similarly to the first embodiment, the above-described carrying-out unit 1 holds the back surface 205 of the substrate 200 that has undergone grinding processing on the holding surface of the holding table 106 located in the carrying-in/out region 301 by the holding surface 31 of the holding pad 3 and conveys the substrate 200 to the cleaning unit 110. As illustrated in FIG. 13, the conveying method of a substrate according to the second embodiment includes a water supply step 1002-2, a holding pad contact step 1001-2, the suction step 1003, and the conveyance step 1004 and is the same as the first embodiment except that the holding pad contact step 1001-2 is executed after the water supply step 1002-2. That is, in the conveying method of a substrate according to the present invention, either the water supply step 1002 or 1002-2 or the holding pad contact step 1001 or 1001-2 may be executed earlier.

In the second embodiment, the water supply step 1002-2 is a step of supplying the water 6 to the back surface 205 of the substrate 200 similarly to the first embodiment. In the second embodiment, the water supply step 1002-2 is a step of filling the inside of the circular recess part 206 to become the space 220 later, i.e. the space 220, with the water 6 before the holding pad contact step 1001-2. In the second embodiment, in the water supply step 1002-2, the control unit 112 stops holding under suction the holding table 106 that is located in the carrying-in/out region 301 and holds the substrate 200 for which grinding processing has been executed. In the water supply step 1002-2, the control unit 112 controls the movement unit 2 of the carrying-out unit 1 to raise the holding pad 3 and, as illustrated in FIG. 14, position the holding pad 3 in the raised state above the substrate 200 on the holding surface of the holding table 106 located in the carrying-in/out region.

In the second embodiment, in the water supply step 1002-2, the control unit 112 opens the opening-closing valve 44 to fill the inside of the circular recess part 206 of the back surface 205 with the water 6 as illustrated in FIG. 14. In the second embodiment, in the water supply step 1002-2, the control unit 112 closes the opening-closing valve 44 when the inside of the circular recess part 206 has been filled with the water 6.

In the second embodiment, the holding pad contact step 1001-2 is a step of bringing the annular protrusion part 207 of the back surface 205 of the substrate 200 into contact with the holding surface 31 of the holding pad 3 and forming the space 220 filled with the water 6 similarly to the first embodiment. In the second embodiment, in the holding pad contact step 1001-2, the control unit 112 controls the movement unit 2 of the carrying-out unit 1 to lower the holding pad 3 as indicated by an arrow in FIG. 15.

In the holding pad contact step 1001-2, as illustrated in FIG. 16, the control unit 112 brings the holding surface 31 of the holding pad 3 into contact with the annular protrusion part 207 of the substrate 200 on the holding surface of the holding table 106 located in the carrying-in/out region to form the above-described space 220 with the boundary between the holding surface 31 of the holding pad 3 and the annular protrusion part 207 of the substrate 200 kept liquid-tight. Thereupon, the substrate 200 is held by the holding pad 3 due to the surface tension of the water 6 with which the inside of the space 220 is filled.

In the second embodiment, after the holding pad contact step 1001-2, the control unit 112 sequentially executes the suction step 1003 illustrated in FIG. 17 and the conveyance step 1004 similarly to the first embodiment. Then, in the second embodiment, for the substrate 200 conveyed to the cleaning unit 110, the front surface 202 and so forth are cleaned by the cleaning brush 120 of the cleaning unit 110 similarly to the first embodiment as illustrated in FIG. 18.

Similarly to the first embodiment, the conveying method of a substrate according to the second embodiment provides an effect that the substrate 200 can be conveyed without direct contact with the bottom surface 209 of the circular recess part 206 for which treatment such as grinding processing has been executed while the holding force is improved, because the above-described carrying-out unit 1 conveys the substrate 200.

First Modification Example

Figure 19:
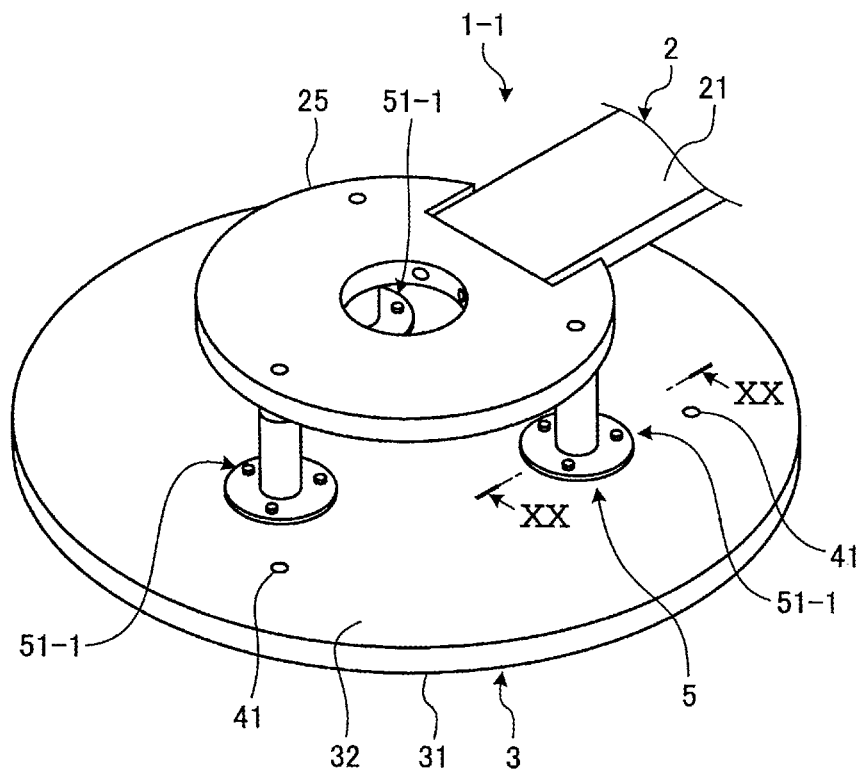
FIG. 19 is a perspective view illustrating the major part of a carrying-out unit according to a first modification example of the first embodiment and the second embodiment.
Figure 20:
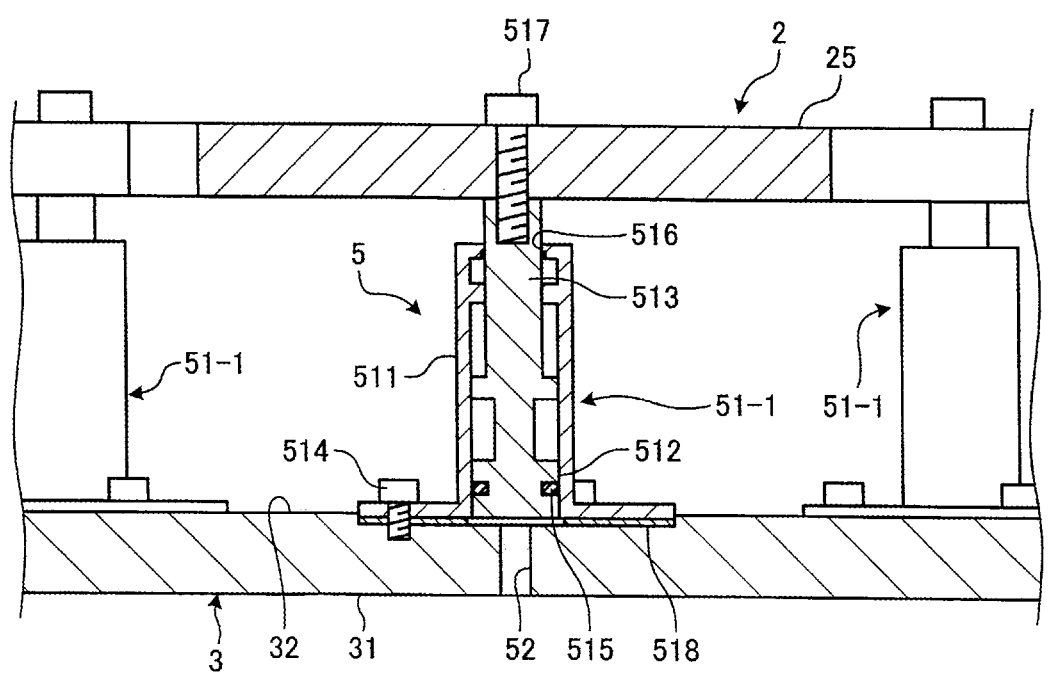
FIG. 20 is a sectional view along line XX-XX in FIG. 19.
Figure 21:
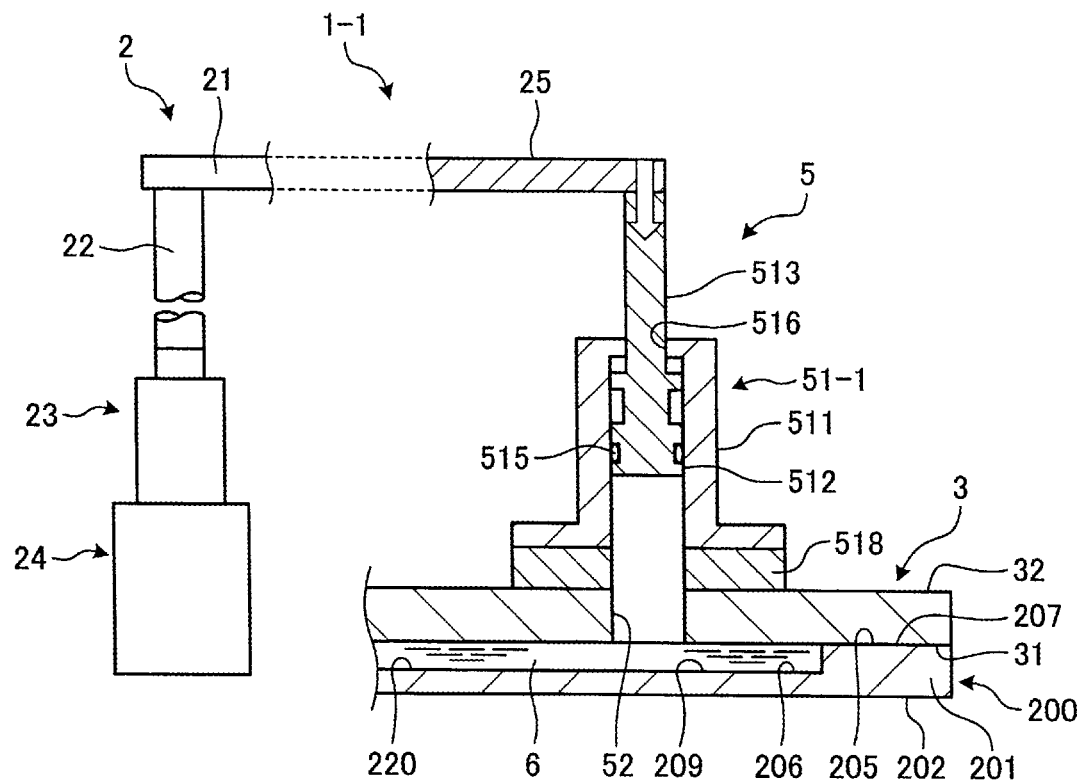
FIG. 21 is a sectional view schematically illustrating the state after both a holding pad contact step and a water supply step in a conveying method of a substrate according to the first modification example of the first embodiment and the second embodiment.
Figure 22:
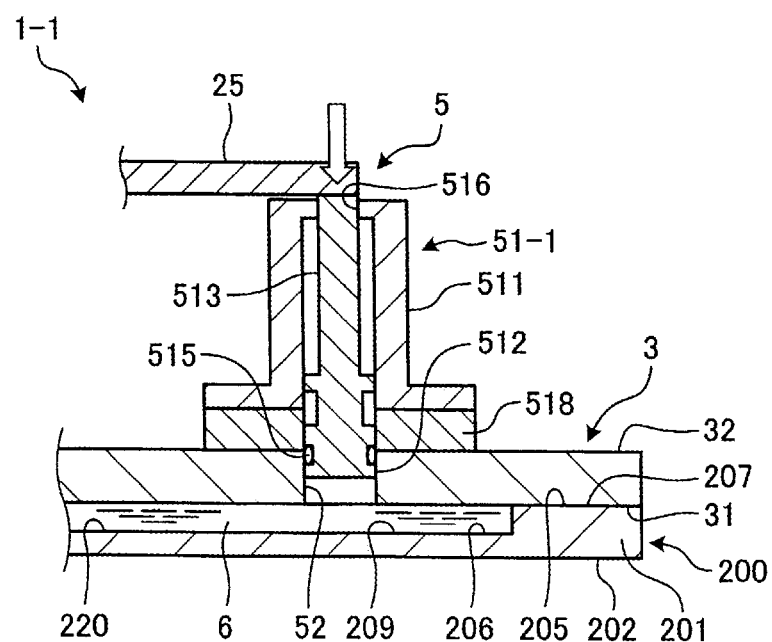
FIG. 22 is a sectional view schematically illustrating the state in which a piston of a suction pump is lowered in a suction step in the conveying method of a substrate according to the first modification example of the first embodiment and the second embodiment.
Figure 23:
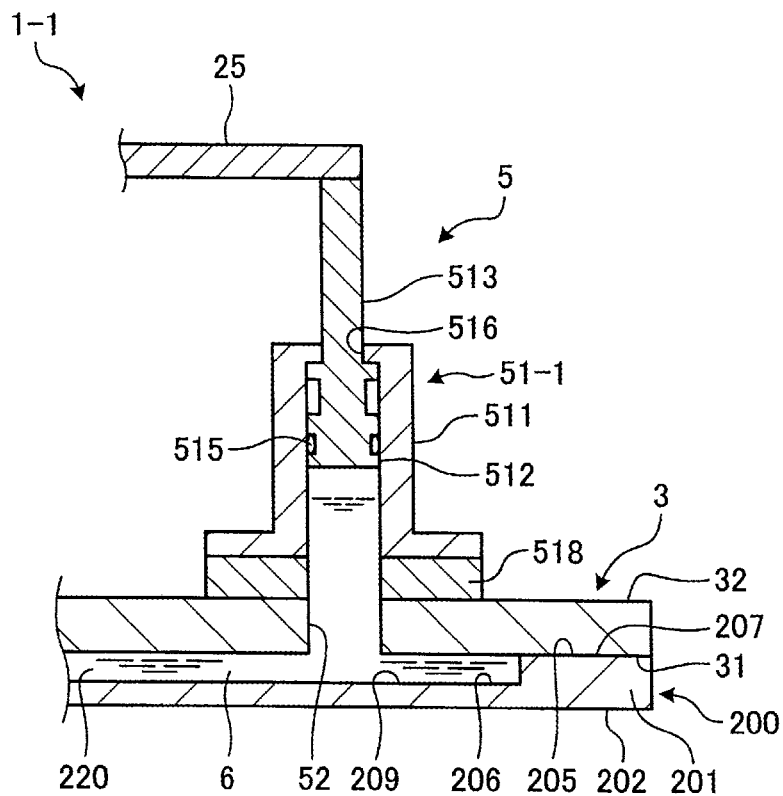
FIG. 23 is a sectional view schematically illustrating the state in which the piston of the suction pump illustrated in FIG. 22 is raised and water in a space is sucked.

A carrying-out unit 1-1 and a conveying method of a substrate according to a first modification example of the first embodiment and the second embodiment of the present invention will be described based on drawings. FIG. 19 is a perspective view illustrating the major part of the carrying-out unit according to the first modification example of the first embodiment and the second embodiment. FIG. 20 is a sectional view along line XX-XX in FIG. 19. FIG. 21 is a sectional view schematically illustrating the state after both a holding pad contact step and a water supply step in the conveying method of a substrate according to the first modification example of the first embodiment and the second embodiment. FIG. 22 is a sectional view schematically illustrating the state in which a piston of a suction pump is lowered in a suction step in the conveying method of a substrate according to the first modification example of the first embodiment and the second embodiment. FIG. 23 is a sectional view schematically illustrating the state in which the piston of the suction pump illustrated in FIG. 22 is raised and water in a space is sucked. In FIG. 19, FIG. 20, FIG. 21, FIG. 22, and FIG. 23, the part same as that of the first embodiment is given the same numeral and description thereof is omitted.

In the carrying-out unit 1-1 according to the first modification example, as illustrated in FIG. 19, the conveying arm 21 of the movement unit 2 is connected to the holding pad 3 through suction pumps 51-1 of the suction unit 5 and an intermediate member 25 with a circular annular shape. One end part of the conveying arm 21 is attached to the intermediate member 25. That is, in the carrying-out unit 1-1 according to the first modification example, the movement unit 2 has the conveying arm 21 connected to the holding pad 3 through the suction pumps 51-1 and the intermediate member 25 coupled to the suction pumps 51-1 and the conveying arm 21, and the suction pumps 51-1 of the suction unit 5 are attached to the holding pad 3.

As illustrated in FIG. 20, the suction pump 51-1 of the suction unit 5 of the carrying-out unit 1-1 according to the first modification example includes a tubular cylinder 511 attached to the upper surface 32 of the holding pad 3, a piston 512 that can move in the Z-axis direction in the cylinder 511, and a piston rod 513 that has a lower end attached to the piston 512 and an upper end attached to the intermediate member 25 and moves in the Z-axis direction together with the piston 512.

The cylinder 511 is formed into a tubular shape and the inside thereof communicates with the through-hole 52 to communicate with the space 220. In the first modification example, the cylinder 511 is attached to the upper surface 32 of the holding pad 3 by screws 514. On the outer circumferential surface of the piston 512, an O-ring 515 that keeps the boundary between the outer circumferential surface and the inner surface of the cylinder 511 liquid-tight is disposed.

In the piston rod 513, one end is formed monolithically with the piston 512, and the other end passes through a passage hole 516 made at the upper end of the cylinder 511 and is attached to the intermediate member 25. In the first modification example, the piston rod 513 is attached to the intermediate member 25 by a screw 517.

Further, in the first modification example, the suction unit 5 includes circular annular seal members 518 that are disposed between the cylinder 511 of the suction pump 51-1 and the upper surface of the holding pad 3 and keep the boundary between them liquid-tight.

After both the holding pad contact step 1001 or 1001-2 and the water supply step 1002 or 1002-2 in the conveying method of a substrate according to the first modification example, as illustrated in FIG. 21, the holding pad 3 is in contact with the annular protrusion part 207 of the substrate 200, the space 220 is thereby formed and is filled with the water 6. In addition, the piston 512 of the suction pump 51-1 is located at an upper end part of the cylinder 511.

In the suction step 1003 in the conveying method of a substrate according to the first modification example, the control unit 112 controls the movement unit 2 to further lower the conveying arm 21 and lower the intermediate member 25 and the piston 512 of the suction pump 51-1 as illustrated in FIG. 22 with the holding pad 3 kept in contact with the annular protrusion part 207 of the substrate 200. In the suction step 1003 in the conveying method of a substrate according to the first modification example, the piston 512 of the suction pump 51-1 is lowered and air in the cylinder 511 is discharged to the outside of the cylinder 511 to remove the air in the cylinder 511. Because the space 220 is not completely sealed between the holding pad 3 and the upper surface of the annular protrusion part 207 of the substrate 200 at this stage, the air in the cylinder 511 is discharged from between them to the outside of the space 220.

In the suction step 1003 in the conveying method of a substrate according to the first modification example, when the piston 512 of the suction pump 51-1 is positioned to a lower end part of the cylinder 511 as illustrated in FIG. 22, the control unit 112 controls the movement unit 2 to raise the conveying arm 21 and raise the intermediate member 25 and the piston 512 of the suction pump 51-1 as illustrated in FIG. 23. Thereupon, the suction pump 51-1 sucks the water 6 with which the inside of the space 220 is filled, and the pressure of the water 6 with which the inside of the space 220 is filled becomes lower than the pressure of the outside of the space 220. Thus, the substrate 200 is pressed against the holding surface 31 of the holding pad 3 due to the pressure difference between the inside and the outside of the space 220. Due to this, the holding surface 31 of the holding pad 3 and the annular protrusion part 207 of the substrate 200 get close contact with each other, so that the force with which the holding pad 3 holds the substrate 200 improves.

In the conveying method of a substrate in which the carrying-out unit 1-1 according to the first modification example conveys the substrate 200, after the piston 512 of the suction pump 51-1 is positioned to the top dead center in the cylinder 511 in the suction step 1003, the control unit 112 continuously controls the movement unit 2 to continue the rising of the conveying arm 21 and execute the conveyance step 1004. In this manner, in the first modification example, the suction unit 5 drives the suction pumps 51-1 in association with the rising and lowering of the conveying arm 21 and sucks the water 6 with which the space 220 is filled.

The carrying-out unit 1-1 according to the first modification example holds the substrate 200 on the holding pad 3 by the surface tension of the water 6 with which the inside of the space 220 is filled, and includes the suction pumps 51-1 that suck the water 6 with which the inside of the space 220 is filled and improve the force with which the holding pad 3 holds the substrate 200. Therefore, the carrying-out unit 1-1 provides an effect that the substrate 200 can be conveyed without direct contact with the bottom surface 209 of the circular recess part 206 for which treatment such as grinding processing has been executed, while the holding force is improved similarly to the first embodiment and so forth.

Further, in the carrying-out unit 1-1 according to the first modification example, because the suction pumps 51-1 suck the water 6 with which the space 220 is filled, in association with the rising and lowering of the conveying arm 21, the suction pumps 51-1 can suck the water 6 in the space 220 in conjunction with operation of the movement unit 2. Because the substrate 200 bends if the water 6 with which the space 220 is filled is excessively sucked, the suction amount needs to be adjusted according to the size of the substrate 200 and the depth and the diameter of the circular recess part 206. However, in the first modification example, the amount of sucked water 6 can be adjusted by adjusting the amount of raising of the conveying arm 21. Therefore, even when the size of the substrate 200 or the depth or diameter of the circular recess part 206 changes, the suction pumps 51-1 do not need to be replaced, and the suction amount can be easily adjusted.

Second Modification Example

Figure 24:
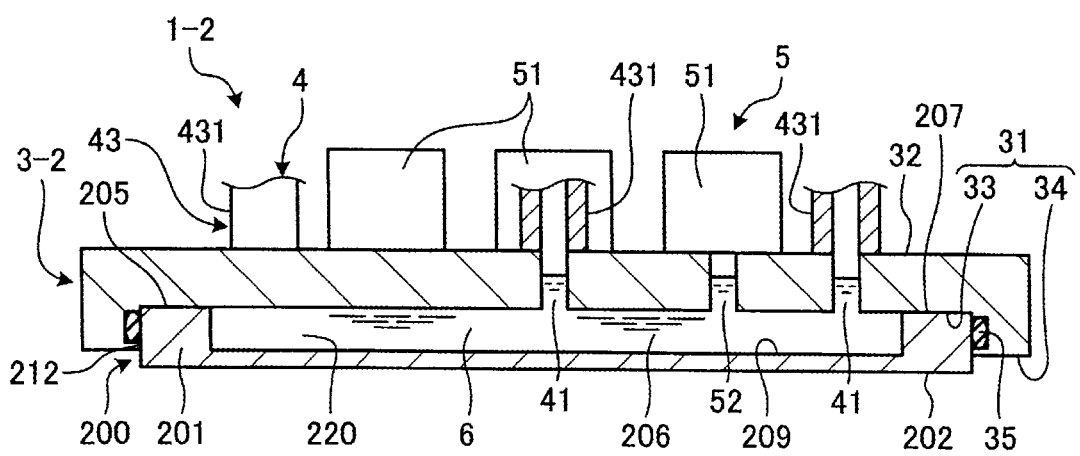
FIG. 24 is a sectional view schematically illustrating a carrying-out unit according to a second modification example of the first embodiment and the second embodiment.

A carrying-out unit 1-2 according to a second modification example of the first embodiment and the second embodiment of the present invention will be described based on a drawing. FIG. 24 is a sectional view schematically illustrating the carrying-out unit according to the second modification example of the first embodiment and the second embodiment. In FIG. 24, the part same as that of the first embodiment is given the same numeral and description thereof is omitted.

In the carrying-out unit 1-2 according to the second modification example, as illustrated in FIG. 24, the outer diameter of a holding pad 3-2 is set larger than that of the substrate 200. The holding surface 31 of the holding pad 3-2 has a second recess part 33 that is formed at the center and that has an outer edge part that gets contact with the upper surface of the annular protrusion part 207 of the substrate 200. The holding surface 31 of the holding pad 3-2 also has a second protrusion part 34 that surrounds the second recess part 33 and that is formed in such a manner to protrude toward the holding table 106 located in the carrying-in/out region 301 relative to the second recess part 33.

In the holding pad 3-2 of the carrying-out unit 1-2 according to the second modification example, in the holding pad contact step 1001 or 1001-2, the outer edge part of the second recess part 33 of the holding surface 31 gets contact with the upper surface of the annular protrusion part 207 of the back surface 205 of the substrate 200, and the second protrusion part 34 gets contact with an outer side surface 212 (equivalent to the side surface) of the substrate 200. This forms the above-described space 220 to be supplied with the water 6 between the holding surface 31 and the substrate 200. The holding pad 3-2 of the carrying-out unit 1-2 according to the second modification example includes, on the inner surface of the second protrusion part 34, an O-ring 35 that gets contact with the outer side surface 212 of the substrate 200 and that keeps the boundary between the inner surface of the second protrusion part 34 and the outer side surface 212 liquid-tight. In the second modification example, the O-ring 35 is composed of resin having elasticity, such as rubber.

The carrying-out unit 1-2 according to the second modification example holds the substrate 200 on the holding pad 3-2 by the surface tension of the water 6 with which the inside of the space 220 is filled, and includes the suction pumps 51 that suck the water 6 with which the inside of the space 220 is filled. Therefore, the carrying-out unit 1-2 can bring the annular protrusion part 207 of the back surface 205 of the substrate 200 into close contact with the second recess part 33 of the holding surface 31 and, similarly to the first embodiment and so forth, provides an effect that the substrate 200 can be conveyed without direct contact with the bottom surface 209 of the circular recess part 206 for which treatment such as grinding processing has been executed, while the holding force is improved. Further, the carrying-out unit 1-2 according to the second modification example holds the substrate 200 in such a manner that the outer edge part of the second recess part 33 of the holding surface 31 is in contact with the upper surface of the annular protrusion part 207 of the back surface 205 of the substrate 200 and that the second protrusion part 34 is in contact with the outer side surface 212 (equivalent to the side surface) of the substrate 200. Therefore, the held substrate 200 can be prevented from being laterally displaced relative to the holding pad 3.

Third Modification Example

Figure 25:
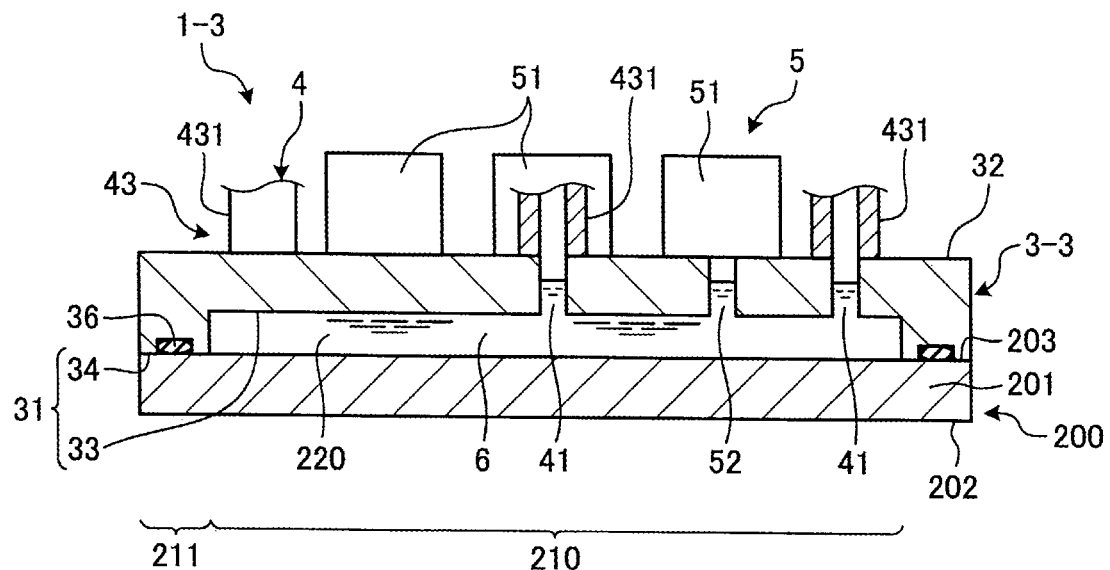
FIG. 25 is a sectional view schematically illustrating a carrying-out unit according to a third modification example of the first embodiment and the second embodiment.

A carrying-out unit 1-3 according to a third modification example of the first embodiment and the second embodiment of the present invention will be described based on a drawing. FIG. 25 is a sectional view schematically illustrating the carrying-out unit according to the third modification example of the first embodiment and the second embodiment. In FIG. 25, the part same as that of the first embodiment is given the same numeral and description thereof is omitted.

The carrying-out unit 1-3 according to the third modification example holds and conveys the substrate 200 in which the thickness of the base 201 is constant across the device region 210 and the outer circumferential surplus region 211 and both the front surface 202 and the back surface 205 of the base 201 are flat. In the carrying-out unit 1-3 according to the third modification example, as illustrated in FIG. 25, the outer diameter of a holding pad 3-3 is set equal to that of the substrate 200. The holding surface 31 of the holding pad 3-3 has the second recess part 33 that is formed at the center and that is opposed to the central part of the substrate 200 with the interposition of an interval. The holding surface 31 of the holding pad 3-3 also has the second protrusion part 34 that surrounds the second recess part 33 and that is formed in such a manner to protrude toward the holding table 106 located in the carrying-in/out region 301 relative to the second recess part 33 and gets contact with the outer circumferential part of the back surface 205 of the substrate 200.

In the holding pad 3-3 of the carrying-out unit 1-3 according to the third modification example, in the holding pad contact step 1001 or 1001-2, the second protrusion part 34 of the holding surface 31 gets contact with the outer circumferential part of the upper surface of the back surface 205 of the substrate 200 to form the above-described space 220 to be supplied with the water 6 between the holding surface 31 and the substrate 200. The holding pad 3-3 of the carrying-out unit 1-3 according to the third modification example includes, on the second protrusion part 34, an O-ring 36 that gets contact with the outer circumferential part of the substrate 200 and that keeps the boundary between the second protrusion part 34 and the outer circumferential part of the substrate 200 liquid-tight. In the third modification example, the O-ring 36 is composed of resin having elasticity, such as rubber.

The carrying-out unit 1-3 according to the third modification example holds the substrate 200 on the holding pad 3-3 by the surface tension of the water 6 with which the inside of the space 220 is filled, and includes the suction pumps 51 that suck the water 6 with which the inside of the space 220 is filled. Therefore, the carrying-out unit 1-3 can bring the outer circumferential part of the back surface 205 of the substrate 200 into close contact with the second protrusion part 34 of the holding surface 31 and, similarly to the first embodiment and so forth, provides an effect that the substrate 200 can be conveyed without direct contact with the bottom surface 209 of the circular recess part 206 for which treatment such as grinding processing has been executed, while the holding force is improved.

Fourth Modification Example

Figure 26:
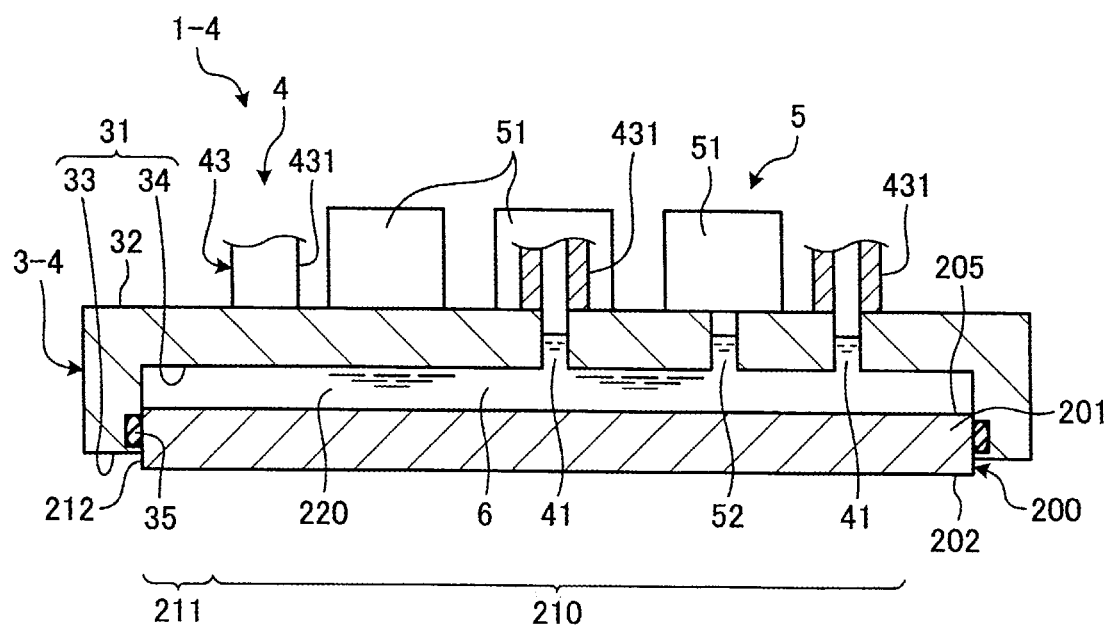
FIG. 26 is a sectional view schematically illustrating a carrying-out unit according to a fourth modification example of the first embodiment and the second embodiment.

A carrying-out unit 1-4 according to a fourth modification example of the first embodiment and the second embodiment of the present invention will be described based on a drawing. FIG. 26 is a sectional view schematically illustrating the carrying-out unit according to the fourth modification example of the first embodiment and the second embodiment. In FIG. 26, the part same as that of the first embodiment is given the same numeral and description thereof is omitted.

The carrying-out unit 1-4 according to the fourth modification example holds and conveys the substrate 200 in which the thickness of the base 201 is constant across the device region 210 and the outer circumferential surplus region 211 and both the front surface 202 and the back surface 205 of the base 201 are flat. In the carrying-out unit 1-4 according to the fourth modification example, as illustrated in FIG. 26, the outer diameter of a holding pad 3-4 is set larger than that of the substrate 200. The holding surface 31 of the holding pad 3-4 has the second recess part 33 that is formed at the center and that is opposed to the back surface 205 of the substrate 200 with the interposition of an interval. The holding surface 31 of the holding pad 3-4 also has the second protrusion part 34 that surrounds the second recess part 33 and that is formed in such a manner to protrude toward the holding table 106 located in the carrying-in/out region 301 relative to the second recess part 33.

In the holding pad 3-4 of the carrying-out unit 1-4 according to the fourth modification example, in the holding pad contact step 1001 or 1001-2, the second recess part 33 of the holding surface 31 is opposed to the back surface 205 of the substrate 200 with the interposition of an interval, and the second protrusion part 34 gets contact with the outer side surface 212 of the substrate 200 to form the above-described space 220 to be supplied with the water 6 between the holding surface 31 and the substrate 200. The holding pad 3-4 of the carrying-out unit 1-4 according to the fourth modification example includes, on the inner surface of the second protrusion part 34, the O-ring 35 that gets contact with the outer side surface 212 of the substrate 200 and keeps the boundary between the inner surface of the second protrusion part 34 and the outer side surface 212 liquid-tight. In the fourth modification example, the O-ring 35 is composed of resin having elasticity, such as rubber.

The carrying-out unit 1-4 according to the fourth modification example holds the substrate 200 on the holding pad 3-4 by the surface tension of the water 6 with which the inside of the space 220 is filled, and includes the suction pumps 51 that suck the water 6 with which the inside of the space 220 is filled. Therefore, the carrying-out unit 1-4 can bring the inner surface of the second protrusion part 34 of the holding surface 31 into close contact with the outer side surface 212 of the substrate 200 and, similarly to the first embodiment and so forth, provides an effect that the substrate 200 can be conveyed without direct contact with the bottom surface 209 of the circular recess part 206 for which treatment such as grinding processing has been executed, while bending is suppressed. Further, the carrying-out unit 1-4 according to the fourth modification example holds the substrate 200 in such a manner that the second protrusion part 34 is in contact with the outer side surface 212 (equivalent to the side surface) of the substrate 200. Therefore, the held substrate 200 can be prevented from being laterally displaced relative to the holding pad 3-4.

Fifth Modification Example

Figure 27:
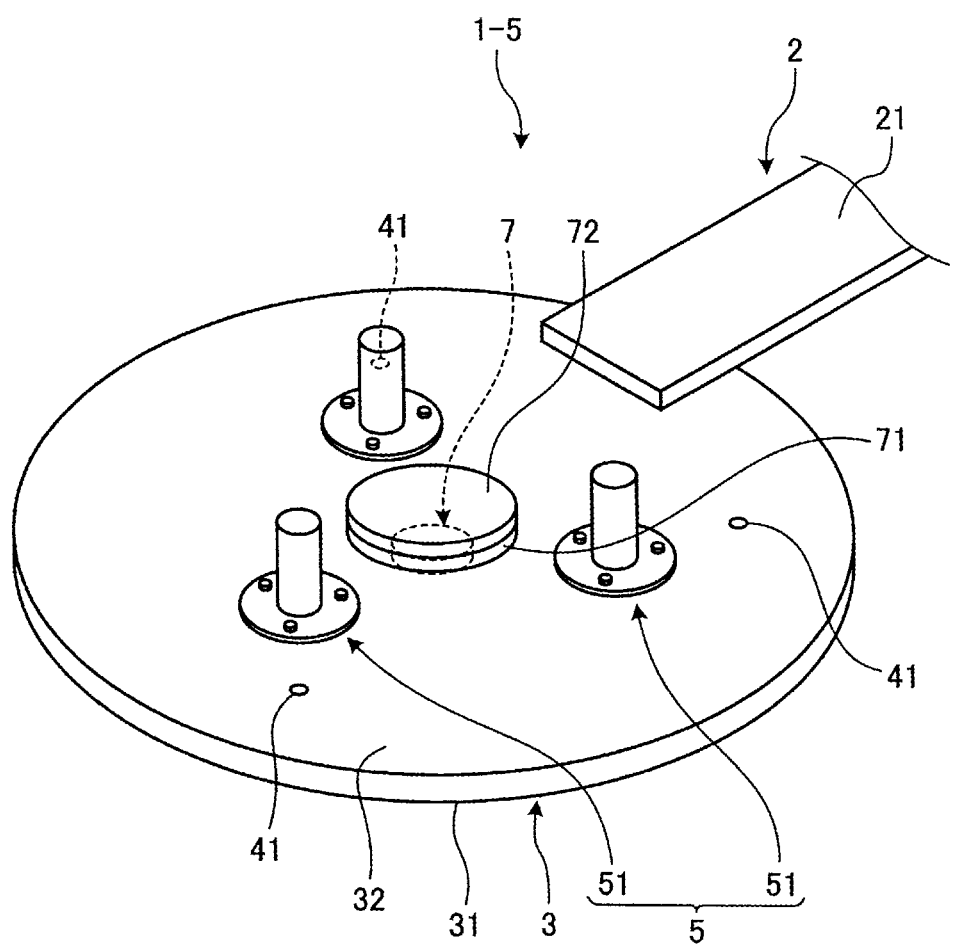
FIG. 27 is a perspective view of the holding pad of a carrying-out unit according to a fifth modification example of the first embodiment and the second embodiment.
Figure 28:
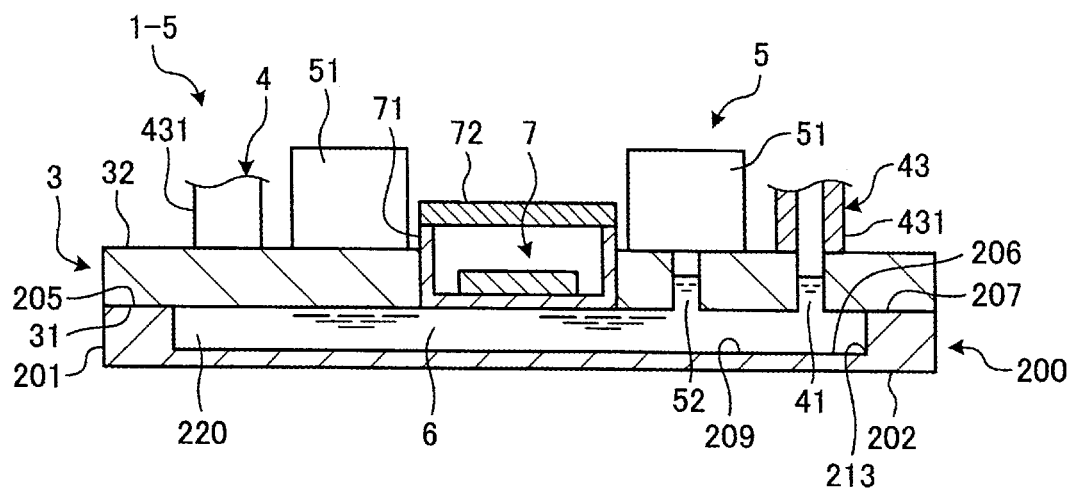
FIG. 28 is a sectional view schematically illustrating the carrying-out unit according to the fifth modification example of the first embodiment and the second embodiment.

A carrying-out unit 1-5 according to a fifth modification example of the first embodiment and the second embodiment of the present invention will be described based on drawings. FIG. 27 is a perspective view of the holding pad of the carrying-out unit according to the fifth modification example of the first embodiment and the second embodiment. FIG. 28 is a sectional view schematically illustrating the carrying-out unit according to the fifth modification example of the first embodiment and the second embodiment. In FIG. 27 and FIG. 28, the part same as that of the first embodiment is given the same numeral and description thereof is omitted.

As illustrated in FIGS. 27 and 28, the carrying-out unit 1-5 according to the fifth modification example is the same as the carrying-out units of the above-described embodiments and modification examples except that the carrying-out unit 1-5 includes an ultrasonic vibrator 7 that gives vibrations to the water 6 with which the space between the holding pad 3 and the substrate 200 is filled. FIG. 27 and FIG. 28 illustrate the case in which the holding pad 3 is the same as the holding pads of the first embodiment and the second embodiment. However, in the present invention, the holding pads 3-2, 3-3, and 3-4 of the second modification example, the third modification example, and the fourth modification example may be employed.

The carrying-out unit 1-5 according to the fifth modification example holds the substrate 200 on the holding pad 3 similarly to the first embodiment and the second embodiment. The ultrasonic vibrator 7 is set in the holding pad 3. In the example illustrated in FIG. 27 and FIG. 28, the ultrasonic vibrator 7 is attached to the bottom surface of a cylindrical member 71 that is attached to the center of the holding pad 3 and in which the lower side is closed and an opening is made on the upper side. The lower surface of the cylindrical member 71 is located on the same plane as the holding surface 31. For the upper surface of the cylindrical member 71, the opening on the upper side is covered by a freely-selected plate-shaped object 72 or the like after the ultrasonic vibrator 7 is disposed. In the example illustrated in FIG. 27 and FIG. 28, the ultrasonic vibrator 7 vibrates through application of a voltage thereto in conveyance of the substrate 200 by the holding pad 3 of the carrying-out unit 1-5 and cleans the back surface 205 that is the held surface of the substrate 200 by vibrating the water 6, to remove contamination.

The carrying-out unit 1-5 according to the fifth modification example holds the substrate 200 on the holding pad 3 by the surface tension of the water 6 with which the inside of the space 220 is filled, and includes the suction pumps 51 that suck the water 6 with which the inside of the space 220 is filled. Therefore, the carrying-out unit 1-5 can hold and convey the substrate 200 with the annular protrusion part 207 of the back surface 205 of the substrate 200 brought into close contact with the holding surface 31 of the holding pad 3. Further, the carrying-out unit 1-5 according to the fifth modification example holds the substrate 200 on the holding pad 3 by the surface tension of the water 6 with which the inside of the space 220 is filled, and conveys the substrate 200. Therefore, the substrate 200 can be conveyed without contact of the holding surface 31 of the holding pad 3 with the bottom surface 209 of the circular recess part 206 of the substrate 200.

Moreover, the carrying-out unit 1-5 according to the fifth modification example can remove foreign matters and grinding dust that adhere to the bottom surface 209 that is the ground surface by vibrating, in conveyance, the water 6 with which the space between the holding pad 3 and the substrate 200 is filled. In addition, when executing cleaning of the bottom surface 209 that is the ground surface in conveyance, the carrying-out unit 1-5 according to the fifth modification example can eliminate cleaning of the substrate 200, which is conventionally executed by the cleaning unit 110 after the substrate 200 for grinding has been executed is conveyed to the cleaning unit 110, or shorten the cleaning time of the substrate 200.

In particular, the carrying-out unit 1-5 according to the fifth modification example conveys the substrate 200 that is what is generally called a TAIKO (registered trademark) wafer in which the circular recess part 206 is formed at the center on the side of the back surface 205 and the annular protrusion part 207 that surrounds the circular recess part 206 is formed at the outer circumferential part. The existing cleaning method involves a problem that it is difficult to remove contamination such as foreign matters and grinding dust that accumulate at a boundary 213 between the annular protrusion part 207 and the circular recess part 206. However, the carrying-out unit 1-5 according to the fifth modification example can remove the contamination from the above-described boundary 213 because the carrying-out unit 1-5 includes the ultrasonic vibrator 7 that vibrates the water 6.

Sixth Modification Example

Figure 29:
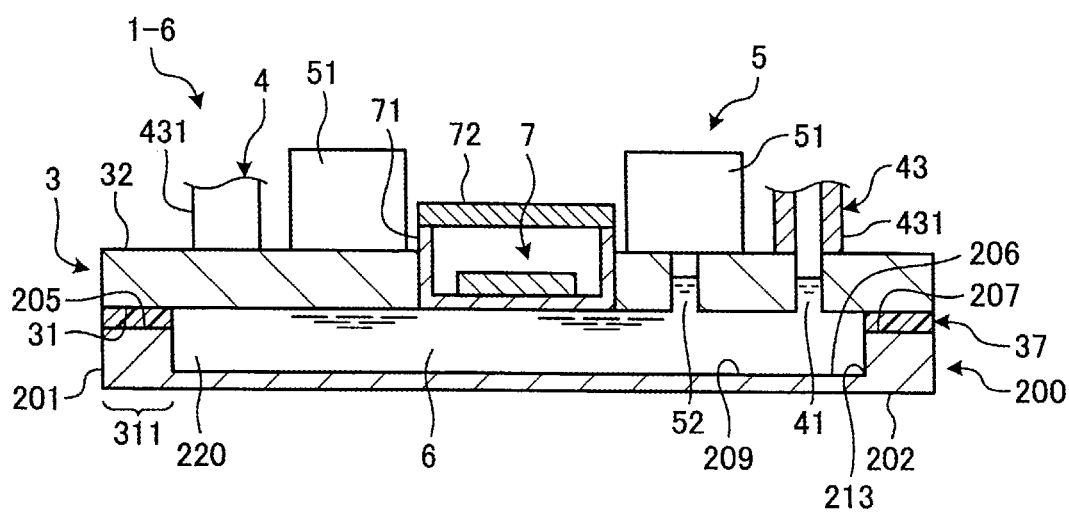
FIG. 29 is a sectional view schematically illustrating a carrying-out unit according to a sixth modification example of the first embodiment and the second embodiment.

A carrying-out unit 1-6 according to a sixth modification example of the first embodiment and the second embodiment of the present invention will be described based on a drawing. FIG. 29 is a sectional view schematically illustrating the carrying-out unit according to the sixth modification example of the first embodiment and the second embodiment. In FIG. 29, the part same as that of the first embodiment and so forth is given the same numeral and description thereof is omitted.

As illustrated in FIG. 29, the carrying-out unit 1-6 according to the sixth modification example is the same as the fifth modification example except that an annular elastic member 37 having a predetermined thickness is disposed on the whole circumference of an outer circumferential part 311 (equivalent to the outer circumferential part of the holding pad 3) of the holding surface 31 that faces the annular protrusion part 207 of the substrate 200 in the holding pad 3. FIG. 29 illustrates the case in which the holding pad 3 is the same as the holding pads of the first embodiment and the second embodiment. However, in the present invention, the holding pads 3-2, 3-3, and 3-4 of the second modification example, the third modification example, and the fourth modification example may be employed.

The annular elastic member 37 is composed of resin having elasticity, such as rubber. In the sixth modification example, the elastic member 37 has the outer diameter equal to that of the holding pad 3 and that of the substrate 200 and has the inner diameter equal to that of the annular protrusion part 207 of the substrate 200. However, the width of the elastic member 37 may be either smaller or larger than the annular protrusion part 207 as long as close contact can be established between the annular protrusion part 207 and the holding pad 3. The carrying-out unit 1-6 according to the sixth modification example brings the annular protrusion part 207 of the substrate 200 into close contact with the elastic member 37 disposed on the outer circumferential part 311, holds the substrate 200 on the holding pad 3, and vibrates the water 6 in the space 220 by the ultrasonic vibrator 7 in conveyance.

In addition to the effect of the fifth modification example, the carrying-out unit 1-6 according to the sixth modification example provides the following effects. That is, the carrying-out unit 1-6 brings the annular protrusion part 207 that is the outer circumferential part of the substrate 200 into contact with the annular elastic member 37 to seal the substrate 200 filled with the water 6. In addition, the carrying-out unit 1-6 increases the frictional resistance of the holding pad 3 against the substrate 200 by the elastic member 37, prevents the holding pad 3 from being displaced from the substrate 200, and can thereby improve the adhesiveness. Thus, lateral displacement of the substrate 200 due to vibrations by the ultrasonic vibrator 7 can be suppressed.

Seventh Modification Example

Figure 30:
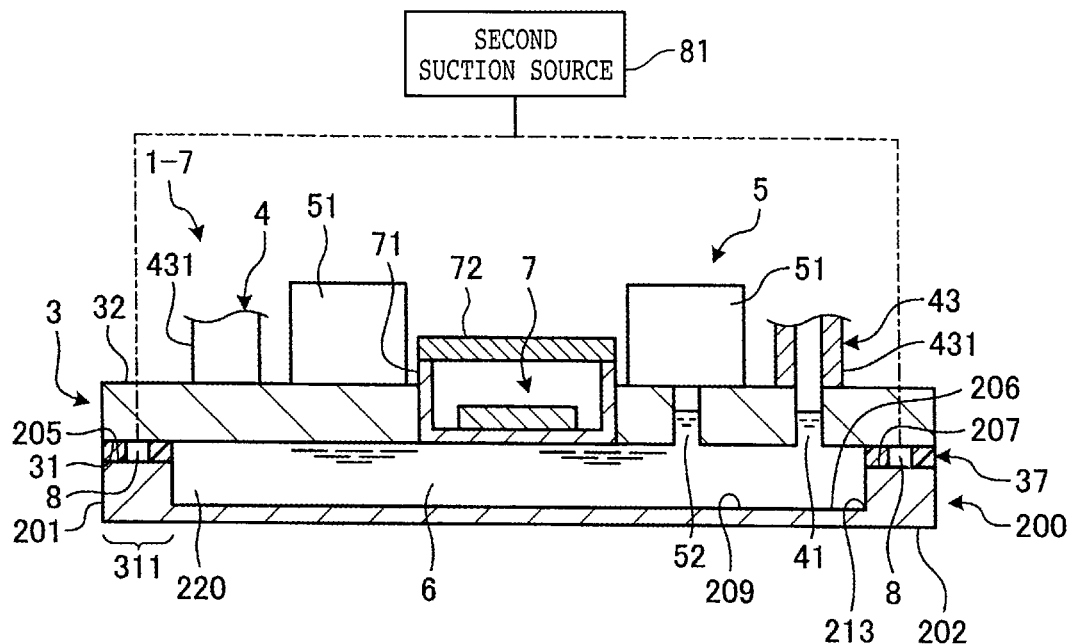
FIG. 30 is a sectional view schematically illustrating a carrying-out unit according to a seventh modification example of the first embodiment and the second embodiment.
Figure 31:
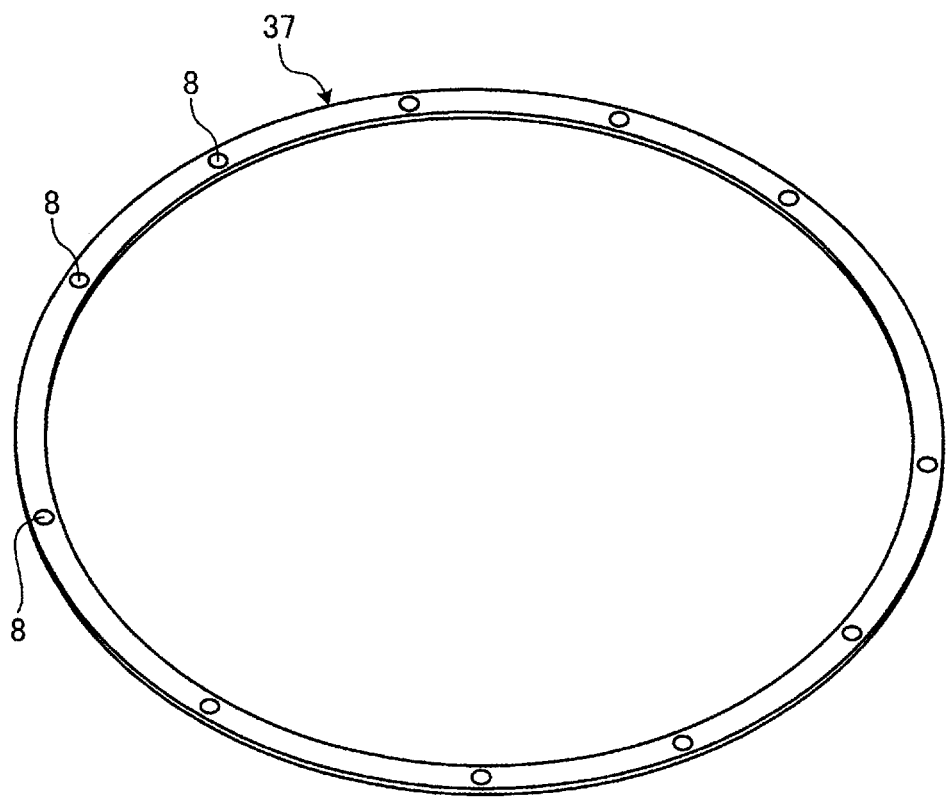
FIG. 31 is a perspective view obtained when an elastic member of the carrying-out unit illustrated in FIG. 30 is viewed from the lower side.

A carrying-out unit 1-7 according to a seventh modification example of the first embodiment and the second embodiment of the present invention will be described based on drawings. FIG. 30 is a sectional view schematically illustrating the carrying-out unit according to the seventh modification example of the first embodiment and the second embodiment. FIG. 31 is a perspective view obtained when the elastic member of the carrying-out unit illustrated in FIG. 30 is viewed from the lower side. In FIG. 30 and FIG. 31, the part same as that of the first embodiment is given the same numeral and description thereof is omitted.

As illustrated in FIG. 30, the carrying-out unit 1-7 according to the seventh modification example is the same as the carrying-out unit of the sixth modification example except that the carrying-out unit 1-7 has suction holes 8 that communicate with a second suction source 81 (equivalent to the suction source) in the annular elastic member 37 disposed on the whole circumference of the outer circumferential part 311 of the holding surface 31 that faces the annular protrusion part 207 of the substrate 200 in the holding pad 3. FIG. 30 illustrates the case in which the holding pad 3 is the same as the holding pads of the first embodiment and the second embodiment. However, in the present invention, the holding pads 3-2, 3-3, and 3-4 of the second modification example, the third modification example, and the fourth modification example may be employed. The second suction source 81 is a suction source different from the above-described suction source 53.

As illustrated in FIG. 31, the suction holes 8 are formed at the center of the elastic member 37 in the width direction in such a manner as to penetrate the elastic member 37 in the thickness direction and are disposed at equal intervals in the circumferential direction of the elastic member 37. Further, the suction holes 8 are connected to the second suction source 81 through holes that are made in the holding pad 3 and are not illustrated in the diagram. Due to being made in the elastic member 37, the suction holes 8 are made in the outer circumferential part 311 of the holding surface 31 of the holding pad 3. In addition, in the present invention, it suffices that one or plural suction holes 8 are made.

The carrying-out unit 1-7 according to the seventh modification example holds under suction the annular protrusion part 207 of the back surface 205 of the substrate 200 on the elastic member 37 by bringing the annular protrusion part 207 of the substrate 200 into close contact with the elastic member 37 and sucking the suction holes 8 by the second suction source 81. As above, the suction holes 8 are what hold under suction the annular protrusion part 207 of the substrate 200. The carrying-out unit 1-7 according to the seventh modification example vibrates the water 6 in the space 220 by the ultrasonic vibrator 7 in conveyance.

Similarly to the sixth modification example, the carrying-out unit 1-7 according to the seventh modification example brings the annular protrusion part 207 that is the outer circumferential part of the substrate 200 into contact with the annular elastic member 37 to seal the substrate 200 filled with the water 6. In addition, the carrying-out unit 1-7 increases the frictional resistance of the holding pad 3 against the substrate 200 by the elastic member 37, prevents the holding pad 3 from being displaced from the substrate 200, and can thereby improve the adhesiveness. Thus, lateral displacement of the substrate 200 due to vibrations by the ultrasonic vibrator 7 can be suppressed.

Further, even when the substrate 200 in which the circular recess part 206 and the annular protrusion part 207 are formed warps, the carrying-out unit 1-7 according to the seventh modification example holds under suction the annular protrusion part 207 of the substrate 200 on the elastic member 37 by the suction holes 8 and therefore can correct (or alleviate) the warpage of the substrate 200 because the elastic member 37 adheres to the annular protrusion part 207 of the substrate 200 by the suction and gets close contact with the annular protrusion part 207. As a result, the carrying-out unit 1-7 according to the seventh modification example can also convey the substrate 200 in which the circular recess part 206 and the annular protrusion part 207 are formed and that warps.

Moreover, even when the substrate 200 in which the circular recess part 206 and the annular protrusion part 207 are formed warps, the carrying-out unit 1-7 according to the seventh modification example corrects (or alleviates) the warpage, holds the substrate 200 on the holding pad 3, and vibrates the water 6 in the space 220 by the ultrasonic vibrator 7 in conveyance to clean the inner surfaces of the circular recess part 206 and the annular protrusion part 207. As a result, the carrying-out unit 1-7 according to the seventh modification example can suppress breakage of the back surface 205 of the substrate 200 at the time of the cleaning.

Further, in the present invention, in the carrying-out units 1-2 and 1-3 according to the second modification example and the third modification example, the suction holes 8 that communicate with the second suction source 81 may be formed in the O-rings 35 and 36 similarly to the seventh modification example.

Moreover, in the present invention, the carrying-out unit 1-7 according to the seventh modification example may have the suction hole 8 in the outer circumferential part 311 of the holding surface 31 of the holding pad 3 without disposing the elastic member 37.

In the fifth modification example, the sixth modification example, and the seventh modification example, the forms in which the water 6 is vibrated by the ultrasonic vibrator 7 in conveyance of the substrate 200 have been described. However, in the present invention, after execution of a conveyance step in which the carrying-out unit 1-5, 1-6, or 1-7 conveys the substrate 200 from the holding table 106 to the cleaning unit 110 and a holding step in which the substrate 200 is placed or held under suction in the cleaning unit 110, the ultrasonic vibrator 7 disposed in the holding pad 3 may be vibrated to vibrate the water 6 in the state in which the substrate 200 is placed on a holding table of the cleaning unit 110. Also in this form, the cleaning force can be enhanced compared with the existing cleaning. Moreover, there is an effect that a drop of the substrate 200 can be prevented more surely because the substrate 200 is held in the cleaning unit 110.

In the fifth modification example, the sixth modification example, and the seventh modification example, explanation has been made by taking as an example the substrate 200 that is a TAIKO (registered trademark) wafer. However, it is also possible to hold and convey the substrate 200 in which the circular recess part 206 and the annular protrusion part 207 are not formed differently from the TAIKO (registered trademark) wafer and, except for recesses and protrusions of patterns formed in the device region 210, the thickness of the base 201 is constant across the device region 210 and the outer circumferential surplus region 211, and both the front surface 202 and the back surface 205 of the base 201 are substantially flat.

In the carrying-out units 1-2, 1-3, 1-4, 1-5, 1-6, and 1-7 according to the above-described second modification example, third modification example, fourth modification example, fifth modification example, sixth modification example, and seventh modification example, the suction unit 5 includes the same suction pump 51 as those of the first embodiment and so forth. However, the suction unit 5 may include the same suction pump 51-1 as that of the first modification example.

The present invention is not limited to the above-described embodiments. That is, the present invention can be carried out with various modifications without departing from the gist of the present invention. In the present invention, the processing apparatus 100 is not limited to the grinding apparatus described in the embodiments and may be various apparatuses such as a cutting apparatus that holds the substrate 200 by a chuck table and executes cutting processing by a cutting blade along planned dividing lines, a laser processing apparatus that executes irradiation with a laser beam with a wavelength having transmissibility or absorbability with respect to the substrate 200, a polishing apparatus that executes polishing processing of the substrate 200, a bite cutting apparatus that executes bite cutting processing of the substrate 200, a plasma apparatus that executes plasma etching or the like for the substrate 200, a tape sticking apparatus that sticks an adhesive tape to the substrate 200, or an inspection apparatus that holds the substrate 200 by a transparent body and inspects the front surface 202 and the back surface 205 of the substrate 200.

Further, in the present invention, the substrate 200 is not limited to the wafer described in the embodiments and so forth and may be a rectangular package substrate having plural devices sealed by resin, a ceramic substrate, a ferrite substrate, a substrate containing at least one of nickel and iron, or the like.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A conveying apparatus having a holding surface that holds a held surface of a substrate to convey the substrate, the conveying apparatus comprising:
    a holding pad that gets contact with an outer circumferential part of the held surface of the substrate or a side surface of the substrate and forms a space to be filled with water between the held surface of the substrate and the holding surface;
    a movement unit that causes the holding pad to move in such a direction as to get closer to or further away from the held surface;
    a water supply unit that supplies the water to the space; and
    a suction unit that sucks the water with which the space is filled and improves a force of holding the substrate,
    wherein the conveying apparatus holds the substrate by the holding surface of the holding pad and conveys the substrate with interposition of the water, and
    wherein the suction unit has a plurality of suction pumps that are connected to a first suction source and the space and includes an opening-closing valve controlled to suck a certain amount of water with which the space is filled, the suction pumps disposed at intervals in the circumferential direction of the holding pad.

2. The conveying apparatus according to claim 1, wherein:
    the movement unit has:
        an arm connected to the holding pad through the plurality of suction pumps, and
        a raising-lowering unit that raises and lowers the arm, and
    the suction unit drives the plurality of suction pumps in association with rising and lowering of the arm and sucks the water with which the space is filled.

3. The conveying apparatus according to claim 1, wherein the held surface held by the holding pad in the substrate has a recess part formed at a center and a protrusion part that surrounds the recess part, and
    the holding pad gets contact with the protrusion part.

4. The conveying apparatus according to claim 1, wherein:
    the holding pad has the holding surface opposed to the held surface,
    the holding surface has a recess part formed at a center and a protrusion part that surrounds the recess part, and
    the protrusion part gets contact with the outer circumferential part of the held surface of the substrate or the side surface of the substrate and forms the space to be supplied with the water between the holding surface and the substrate.

5. The conveying apparatus according to claim 1, further comprising:
    an ultrasonic vibrator that gives vibrations to the water.

6. The conveying apparatus according to claim 1, wherein the conveying apparatus has one or a plurality of suction holes that communicate with a second suction source and hold under suction the outer circumferential part of the held surface in an outer circumferential part of the holding pad.

7. The conveying apparatus according to claim 1, wherein each of the plurality of suction pumps includes an opening-closing valve.

8. The conveying apparatus according to claim 1, wherein the holding surface is a flat holding surface.

9. A conveying method of a substrate in which a held surface of the substrate is held by a holding surface of a holding pad and the substrate is conveyed, the conveying method comprising:
    a water supply step of supplying water to the held surface of the substrate;
    after the water supply step, a holding pad contact step of bringing an outer circumferential part of the held surface of the substrate or a side surface of the substrate into contact with the holding surface and forming a space to be filled with the water;
    after the holding pad contact step, a suction step of sucking, with a suction unit, the water with which the space is filled and improving a force of holding the substrate, the suction unit having a plurality of suction pumps that are connected to a first suction source and the space and includes an opening-closing valve controlled to suck a certain amount of water with which the space is filled, the suction pumps disposed at intervals in the circumferential direction of the holding pad; and
    after the suction step, a conveyance step of conveying the substrate held by the holding pad with interposition of the water.

10. The conveying method according to claim 9, wherein each of the plurality of suction pumps includes an opening-closing valve.

11. The conveying method according to claim 9, wherein the holding surface is a flat holding surface.

12. A conveying apparatus having a holding surface that holds a held surface of a substrate to convey the substrate, the conveying apparatus comprising:
- a holding pad that gets contact with an outer circumferential part of the held surface of the substrate or a side surface of the substrate and forms a space to be filled with water between the held surface of the substrate and the holding surface;
- a movement unit that causes the holding pad to move in such a direction as to get closer to or further away from the held surface;
- a water supply unit that supplies the water to the space;
- a suction unit that sucks the water with which the space is filled and improves a force of holding the substrate; and
- an ultrasonic vibrator that gives vibrations to the water,
- wherein the conveying apparatus holds the substrate by the holding pad and conveys the substrate with interposition of the water.

* * * * *